(12) United States Patent
Linam et al.

(10) Patent No.: US 9,190,129 B2
(45) Date of Patent: Nov. 17, 2015

(54) CONTINUOUS TUNING OF PREAMBLE RELEASE TIMING IN A DOUBLE DATA-RATE MEMORY DEVICE INTERFACE

(71) Applicant: Avago Technologies General IP (Singapore) Pte. Ltd., Singapore (SG)

(72) Inventors: David Linam, Fort Collins, CO (US); Scott T. Evans, Fort Collins, CO (US); Guy Humphrey, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 121 days.

(21) Appl. No.: 13/906,610

(22) Filed: May 31, 2013

(65) Prior Publication Data

US 2014/0355359 A1    Dec. 4, 2014

(51) Int. Cl.
*G11C 7/22* (2006.01)
*G06F 13/16* (2006.01)
*H04L 7/00* (2006.01)

(52) U.S. Cl.
CPC ............ *G11C 7/222* (2013.01); *G06F 13/1689* (2013.01); *G11C 7/22* (2013.01); *H04L 7/0037* (2013.01); *H04L 7/0041* (2013.01)

(58) Field of Classification Search
None
See application file for complete search history.

(56) References Cited

U.S. PATENT DOCUMENTS

| | | | |
|---|---|---|---|
| 5,692,165 A * | 11/1997 | Jeddeloh et al. | 713/400 |
| 5,819,076 A * | 10/1998 | Jeddeloh et al. | 713/401 |
| 5,857,095 A * | 1/1999 | Jeddeloh et al. | 713/401 |
| 6,442,644 B1 * | 8/2002 | Gustavson et al. | 711/105 |
| 6,483,359 B2 * | 11/2002 | Lee | 327/158 |
| 7,126,399 B1 * | 10/2006 | Lee | 327/261 |
| 7,292,500 B2 * | 11/2007 | Liu et al. | 365/233.1 |
| 7,433,262 B2 | 10/2008 | Vergnes et al. | |
| 7,671,648 B2 * | 3/2010 | Kwak | 327/158 |
| 7,802,153 B1 * | 9/2010 | Cekleov et al. | 714/712 |
| 7,911,857 B1 * | 3/2011 | Venkataraman et al. | 365/189.15 |
| 8,314,641 B2 | 11/2012 | Kim | |
| 8,862,925 B2 * | 10/2014 | DeMarco | 713/401 |
| 2002/0087768 A1 * | 7/2002 | Srikanth et al. | 710/118 |
| 2002/0188820 A1 * | 12/2002 | Taruki | 711/218 |
| 2003/0002316 A1 * | 1/2003 | Morita et al. | 365/63 |
| 2006/0107011 A1 * | 5/2006 | Nystuen et al. | 711/167 |
| 2007/0217559 A1 * | 9/2007 | Stott et al. | 375/355 |
| 2008/0068904 A1 * | 3/2008 | Hughes | 365/193 |

(Continued)

OTHER PUBLICATIONS

Povazanec, J et al., "On Design of Low-Noise Adaptive Output Drivers", IEEE Transactions on Circuits and SYstems-1: Fundamental Theory and Applications, vol. 46, No. 12 Dec. 1999.*

(Continued)

*Primary Examiner* — Steven Snyder

(57) ABSTRACT

Preamble release training in a double data-rate dynamic random access memory interface uses feedback from read operations to adjust the preamble release signal so that the preamble release signal continues to be activated close to the middle of the preamble. A first signal, and then a second signal, are generated in response to an initiation of a read operation. The first and second signals are characterized by a delay from the initiation of the read operation of one or more clock cycles plus a fine delay contributed by an adjustable delay circuit. The first signal is provided to a data strobe parking circuit that uses it to release or un-park the data strobe signal lines. The second signal is phase-compared with the data strobe signal associated with incoming data during the read operation. The adjustable delay circuit is adjusted in response to the result of the comparison.

21 Claims, 39 Drawing Sheets

(56) References Cited

U.S. PATENT DOCUMENTS

| | | | |
|---|---|---|---|
| 2008/0094918 A1* | 4/2008 | Fujizoe | 365/189.07 |
| 2010/0039875 A1* | 2/2010 | Stott et al. | 365/193 |
| 2011/0063931 A1 | 3/2011 | Linam et al. | |
| 2012/0039136 A1* | 2/2012 | Linam | 365/189.18 |
| 2012/0307577 A1* | 12/2012 | Sriadibhatla et al. | 365/193 |
| 2013/0010546 A1 | 1/2013 | Wang et al. | |
| 2013/0208553 A1* | 8/2013 | Hunt et al. | 365/193 |
| 2013/0315014 A1* | 11/2013 | Dearth et al. | 365/193 |

OTHER PUBLICATIONS

DDR3 Memory Interface Solution. Datasheet [online]. Rambus Inc., 2010 [retrieved on Feb. 8, 2013]. Retrieved from the Internet: <http://www.rambus.com/assets/documents/products/ddr3_mis_pdp_rmbs.pdf>.

Enhanced FlexPhase Timing Adjustments. Datasheet [online]. Rambus Inc. [retrieved on Feb. 8, 2013]. Retrieved from the Internet: <http://www.rambus.com/us/technology/innovations/detail/flexphase_timing_enhanced.html>.

FlexPhase Timing Adjustments. Datasheet [online]. Rambus Inc. [retrieved on Feb. 8, 2013]. Retrieved from the Internet: <http://www.rambus.com/us/technology/innovations/detail/flexphase_timing.html>.

Allan, G. and Defazio, J., IP Solves the Increasing Challenge of Implementing an Interface to Off-Chip DDR SDRAM. DesignCon 2007 [online], [retrieved on Feb. 8, 2013]. Retrieved from the Internet: <http://www.iec.org/newsletter/jan08_2/tech_briefing_ip.pdf>.

External Memory Interfaces in Stratix V Devices. Datasheet [online]. Altera Corporation, Dec. 28, 2012. [retrieved on Feb. 8, 2013]. Retrieved from the Internet: <http://www.altera.com/literature/hb/stratix-v/stx5_51008.pdf>.

* cited by examiner

| STATE | RD_DET | FINE_DELAY[3] | LAUNCH_NS | MUX_SEL | AUTO_FB_LAT_EN | CODE_UPDATE |
|---|---|---|---|---|---|---|
| 0 | 0 | 0 | 0 | 0 | 0 | 0 |
|   | 0 | 1 | 0 | 0 | 0 | 0 |
|   | 1 | 0 | 1 | 0 | 0 | 0 |
|   | 1 | 1 | 0 | 0 | 0 | 0 |
| 1 | 0 | 0 | 0 | 0 | 0 | 0 |
|   | 0 | 1 | 1 | 0 | 0 | 0 |
|   | 1 | 0 | 1 | 0 | 0 | 0 |
|   | 1 | 1 | 1 | 0 | 0 | 0 |
| 2 | 0 | 0 | 0 | 0 | 0 | 0 |
|   | 0 | 1 | 0 | 0 | 0 | 0 |
|   | 1 | 0 | 0 | 0 | 0 | 0 |
|   | 1 | 1 | 0 | 0 | 0 | 0 |
| 3 | 0 | 0 | 0 | 0 | 0 | 0 |
|   | 0 | 1 | 0 | 0 | 0 | 0 |
|   | 1 | 0 | 0 | 0 | 0 | 0 |
|   | 1 | 1 | 0 | 0 | 0 | 0 |
| 4 | 0 | 0 | 1 | 1 | 0 | 0 |
|   | 0 | 1 | 0 | 1 | 0 | 0 |
|   | 1 | 0 | 0 | 1 | 0 | 0 |
|   | 1 | 1 | 1 | 1 | 0 | 0 |
| 5 | 0 | 0 | 0 | 1 | 0 | 0 |
|   | 0 | 1 | 1 | 1 | 0 | 0 |
|   | 1 | 0 | 1 | 1 | 0 | 0 |
|   | 1 | 1 | 0 | 1 | 0 | 0 |
| 6 | 0 | 0 | 0 | 1 | 0 | 0 |
|   | 0 | 1 | 0 | 1 | 0 | 0 |
|   | 1 | 0 | 0 | 1 | 0 | 0 |
|   | 1 | 1 | 0 | 1 | 0 | 0 |

FIG. 5A

| STATE | RD_DET | FINE_DELAY[3] | LAUNCH_NS | MUX_SEL | AUTO_FB_LAT_EN | CODE_UPDATE |
|---|---|---|---|---|---|---|
| 7 | 0 | 0 | 0 | 1 | 0 | 0 |
|   | 0 | 1 | 0 | 1 | 0 | 0 |
|   | 1 | 0 | 0 | 1 | 0 | 0 |
|   | 1 | 1 | 0 | 1 | 0 | 0 |
| 8 | 0 | 0 | 0 | 0 | 1 | 0 |
|   | 0 | 1 | 0 | 0 | 1 | 0 |
|   | 1 | 0 | 1 | 0 | 1 | 0 |
|   | 1 | 1 | 0 | 0 | 1 | 0 |
| 9 | 0 | 0 | 0 | 0 | 0 | 1 |
|   | 0 | 1 | 0 | 0 | 0 | 1 |
|   | 1 | 0 | 0 | 0 | 0 | 1 |
|   | 1 | 1 | 0 | 0 | 0 | 1 |
| 10 | 0 | 0 | 0 | 0 | 0 | 0 |
|   | 0 | 1 | 0 | 0 | 0 | 0 |
|   | 1 | 0 | 1 | 0 | 0 | 0 |
|   | 1 | 1 | 0 | 0 | 0 | 0 |

FIG. 5B

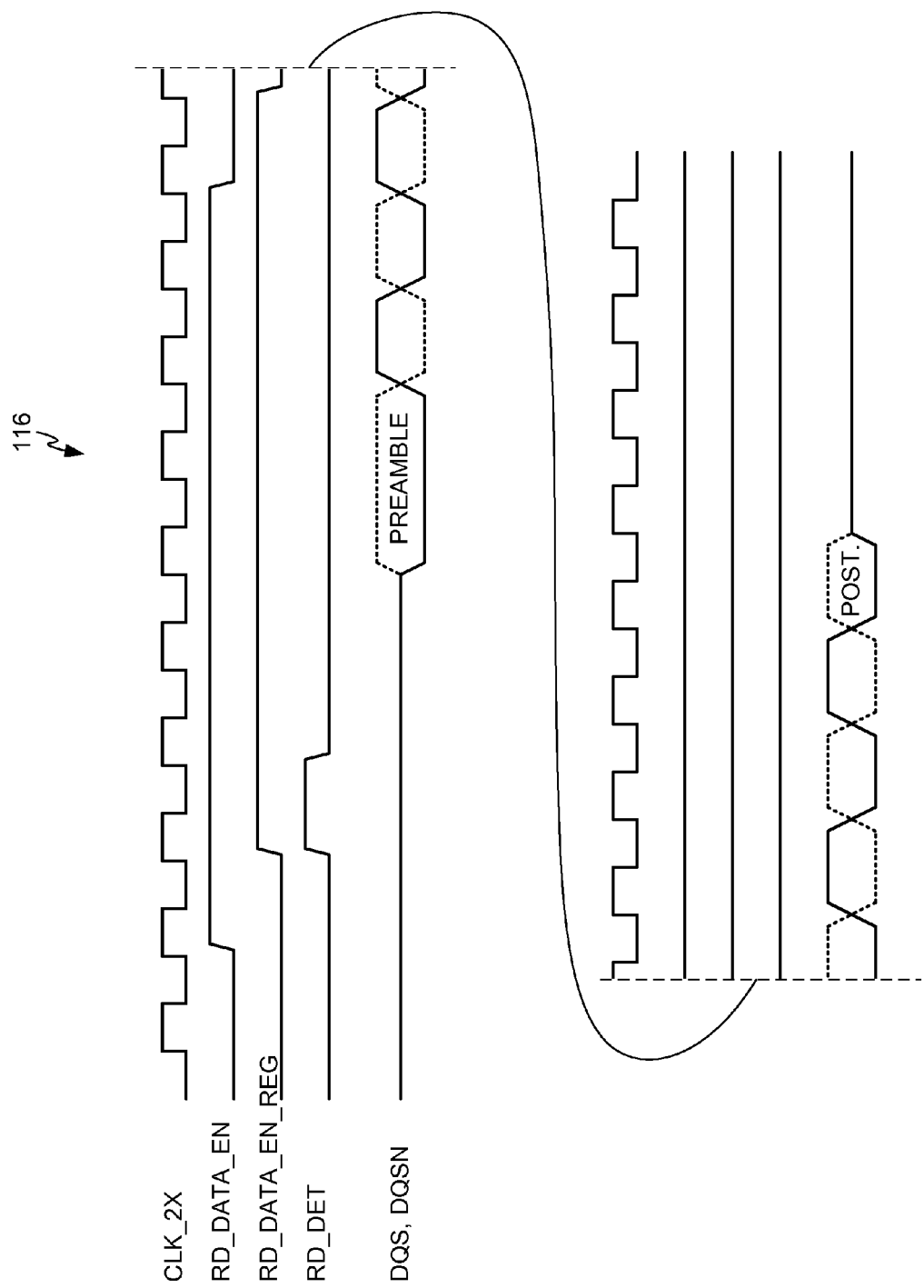

CONTINUOUS TUNING OF PREAMBLE RELEASE TIMING IN A DOUBLE DATA-RATE MEMORY DEVICE INTERFACE

BACKGROUND

As computers and computer processors increase in performance, memory access performance becomes a significant factor affecting overall system performance. If an interface that communicates data between a memory device and a memory controller or other application device operates more slowly than a processor can use data, the interface can reduce the data processing capacity of the entire computer. For dynamic random access memory (DRAM) devices, which are commonly used as the main working memory for a computer, various interconnect technologies have been developed over the years. One such interconnect technology is used for synchronous DRAMs, or SDRAMs, which utilize a source synchronous interface, where the source of data during a data transfer is relied upon to provide a data strobe signal that is used by the target of the data transfer to capture such data as it is being transferred over a data line to the target. In particular, the capture of data on a data line is typically latched by the rising or falling edge of the data strobe signals, for example, so that the value transmitted on a data line when the data strobe signal transitions from low to high, or vice-versa, will be latched into a data latch in the target.

DRAM memory elements, such as double data rate (DDR) memory elements, contain multiple buses. A command and address bus is formed by a number of signals, such as, for example, a column-address strobe (CAS), row-address strobe (RAS), write enable (WE), clock enable (CKE), chip-select (CS), address (ADDR), bank address (BA) signals, and differential clock signals (CK and CKN). DDR3 memory elements operate with differential data strobe signals DQS and DQSN, which enable source synchronous data capture at twice the clock frequency. The data bus between the host logic circuitry and the DRAM includes the data signals (DQ) and data strobe signals (DQS and DQSN).

In DDR3 DRAM systems, data is transferred in bursts for both read and write operations, sending or receiving a series of four (referred to as burst chop 4 or BC4) or eight (referred to as burst length 8 or BL8) data words with each memory access. For read operations, data bursts of various lengths are transmitted by the DRAM edge-aligned with a data strobe signal. For write operations, data bursts of various lengths are received by the DRAM element with a 90-degree phase-delayed data strobe signal. The one or more data strobe signal lines between the host logic circuitry and the DRAM are bidirectional. The data strobe signal issued by the DRAM is used by the host logic circuitry to capture data during read operations. The data strobe signal issued by the host logic circuitry is used by the DRAM to capture data during write operations.

When the data bus is inactive, i.e., no data is being transferred, the data strobe signal lines assume a tristate or termination voltage level $V_{TT}$ that, for DDR3 DRAM systems, is one-half the supply voltage $V_{DD}$. The termination voltage thus defines neither a logic-0 nor a logic-1 level. In a read operation, the host logic circuitry issues a read command and communicates a clock signal to the source DRAM. In response to the read command, and after a DRAM internal delay, the DRAM causes the data strobe signal lines to change state from the termination voltage to a "preamble" state that, for DDR3 DRAM systems, is a logic-0 level with a duration of a full cycle of the DRAM clock, or two cycles of CLK_2X. Following the preamble, the DRAM issues one or more bursts of data accompanied by the requisite data strobe signals. The host logic circuitry may use the preamble to prepare itself to receive the data. The host logic circuitry uses the data strobe signals to capture or register the data. The host logic circuitry registers the incoming data signals with the rising edges of the differential data strobe signals, i.e., the rising edges of both DQS and DQSN.

The host logic circuitry includes differential receivers to receive the data strobe signals. When both inputs of a differential receiver are driven to the termination voltage level $V_{TT}$, the output of the differential receiver is undefined. If the undefined output were allowed to propagate to logic that handles incoming data, spurious edges on the data strobe signals could cause erroneous results. Therefore, the host logic circuitry commonly includes "parking" logic to force the output of the differential data strobe signal receivers to a defined logic value until the preamble arrives. The parking logic un-parks the data strobe signal during the preamble and then re-parks the data strobe signal during the postamble. The preamble thus serves as a window in which to un-park the differential data strobe signal receiver outputs. It is generally desirable to un-park the differential data strobe signal receiver outputs in the middle of the preamble. Therefore, methods have been developed to generate a parking control signal or preamble release signal that goes active in the middle of the preamble. Such methods include feedback-based training methods that seek the optimal delay value for a programmable delay element to delay activation of the parking control signal until the middle of the preamble.

A known training method involves setting or programming the programmable delay value and issuing a read command. In response to the read command, a pulse is propagated through the programmable delay element and thus delayed. The parking logic uses this delayed pulse as a preamble release signal to un-park the data strobe signal. When the memory responds to the read command by activating the data strobe signal (i.e., transitioning from the termination voltage to a preamble followed by a number of data strobe signal transitions), the incoming data strobe signal is sampled with a register clocked by the preamble release signal. If the data strobe signal is sampled during the preamble, the sampling register will sample or capture a logic-0. If the data strobe signal is sampled just after the first data strobe signal edge, the sampling register will sample or capture a logic-1. The procedure is repeated in an iterative manner, setting a different delay value on each iteration. From the results captured in the sampling register, an optimum delay value that places the preamble release signal in the middle of the preamble can be computed.

After the training method has been completed and the programmable delay element has been set to the optimal value, drift in the timing relationship between the host logic circuitry and the DRAM can cause the preamble release signal to lose alignment with the middle of the preamble. Periodically re-training the preamble release signal is possible but not an optimal solution because it requires periodically halting the memory system.

SUMMARY

Embodiments of the invention relate to a preamble release training system and method in a double data-rate dynamic random access memory (DRAM) interface. In exemplary embodiments, the method comprises: generating a first signal in response to an initiation of a read operation, wherein the first signal is delayed from the initiation of the read operation by one or more clock cycles plus a fine delay provided by an adjustable delay circuit; providing the first signal to a data strobe parking circuit; generating a second signal in response to the initiation of the read operation, the second signal delayed by the adjustable delay circuit; receiving a data strobe signal associated with incoming data during the read operation; comparing an edge of the second signal with an edge of the data strobe signal associated with incoming data during the read operation; and adjusting the adjustable delay circuit in response to a result of comparing the edge of the second signal with the edge of the data strobe signal.

In exemplary embodiments, a system for preamble release training in an interface between an application-specific integrated circuit (ASIC) and a double data-rate memory device includes: an adjustable delay circuit; an auto-tune circuit configured to generate a first signal and a second signal in response to an initiation of a read operation by the ASIC, the adjustable delay circuit delaying the first signal to produce a preamble release signal and delaying the second signal to produce an auto-tune clock signal; a data strobe parking circuit having an input receiving a data strobe signal associated with incoming data during the read operation and having an output switchable between a data strobe signal and a fixed voltage, wherein switching of the preamble release is controlled by the preamble release signal; and a comparator circuit configured to compare an edge of the auto-tune clock signal with an edge of the data strobe signal associated with incoming data during the read operation, wherein the auto-tune circuit provides an adjustment signal to the adjustable delay in response to a result of comparing the edge of the second signal with the edge of the data strobe signal.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

FIG. 5A is a portion of a state machine table for the state machine of the preamble logic of FIG. 3.

FIG. 5B is a continuation of FIG. 5A.

FIG. 6 is a timing diagram illustrating a first exemplary read operation event.

DETAILED DESCRIPTION

Figure 1:
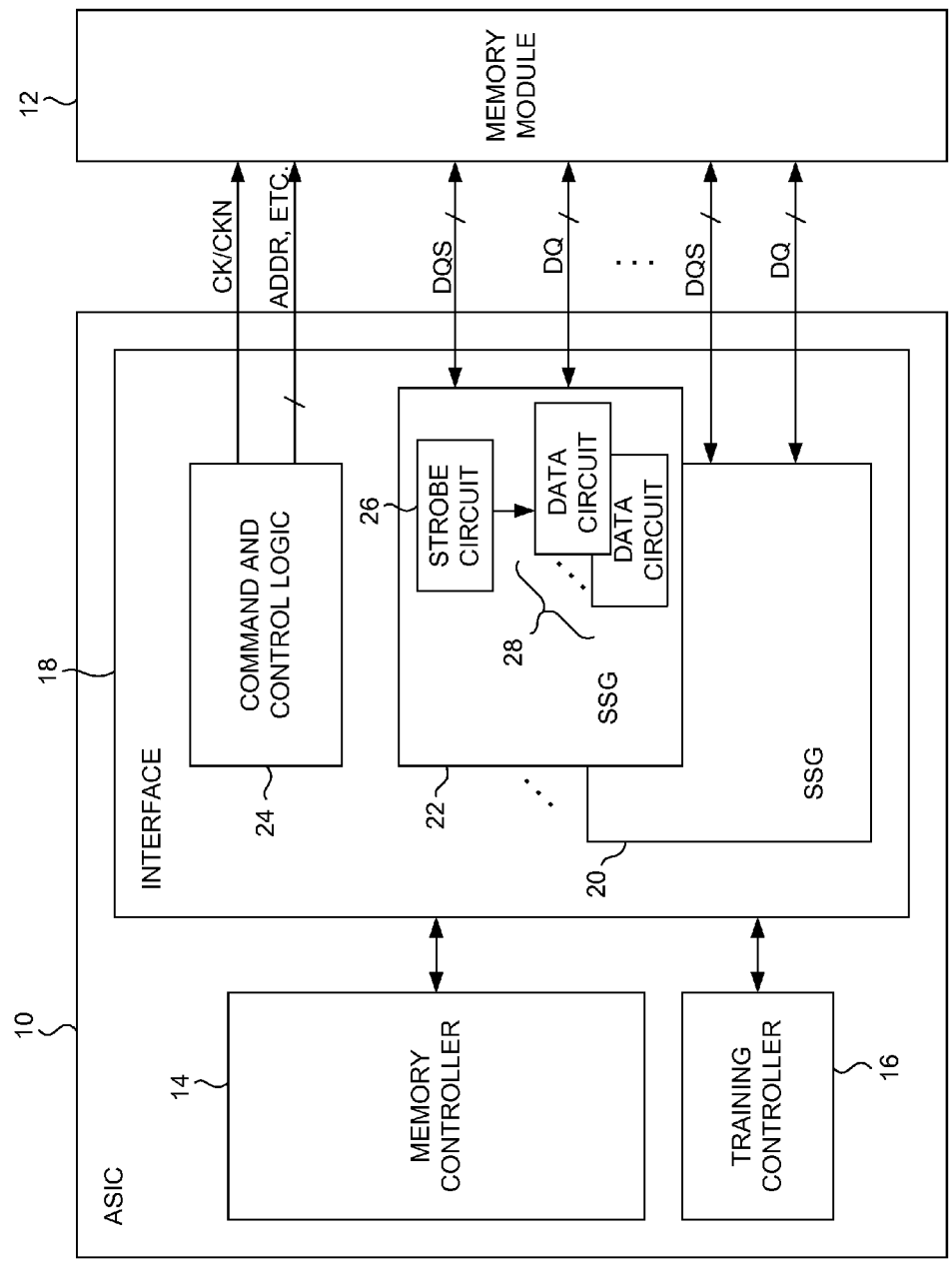
FIG. 1 is a block diagram of an application-specific integrated circuit (ASIC) having a dynamic random access memory (DRAM) interface with a preamble release training system, in accordance with an exemplary embodiment of the invention.

As illustrated in FIG. 1, in an illustrative or exemplary embodiment of the invention, an application-specific integrated circuit (ASIC) 10 is interfaced with a double data rate (DDR) dynamic random access memory (DRAM) 12. DRAM 12 can comprise any suitable type of commercially available DDR3 or similar DRAM (or DRAM module). The ASIC 10 includes, among other elements (not shown for purposes of clarity), a memory controller 14, a training controller 16, and an interface 18. Interface 18 includes at least one (but more preferably two or more) source-synchronous groups (SSGs) 20, 22, etc., and command and control logic 24. Each SSG 20, 22, etc. communicates a group of bidirectional data signals (DQ) and a bidirectional data strobe signal (DQS) with DRAM 12. In the exemplary embodiment, each group of data signals consists of eight signal lines, such that data can be communicated between each source-synchronous group 20, 22, etc., and DRAM 12 in the form of 8-bit words, and each data strobe signal is a differential signal consisting of true strobe signal DQS and complement strobe signal DQSN. Read and write operations can be performed in bursts of such 8-bit words, provided sequentially and communicated between one of the source-synchronous groups 20, 22, etc., and DRAM 12. For example, read and write operations can be performed in bursts of eight words, a mode referred to in the art as "burst length 8" or "BL8." Alternatively, read and write operations can be performed in bursts of four words, a mode referred to in the art as "burst chop 4" or "BC4."

Each of SSGs 20, 22, etc., includes a data strobe circuit 26 and eight data circuits 28, each corresponding to one bit of the data word. But for the novel features described below with regard to data strobe circuit 26 and preamble release training, the structure of interface 18 and the manner in which interface 18 operates are well understood by persons of ordinary skill in the art, as such aspects are largely dictated by specifications provided by manufacturers of DRAM 12. Accordingly, but for the features described below, the structure of interface 18 and its manner of operation are not described in detail herein.

In response to a write command received from memory controller 14 of ASIC 10, interface 18 provides data signals that represent a burst of data to be written to DRAM 12 and generates a data strobe signal having the required timing relationship (i.e., phase alignment) to the data signals. In response to a read command received from memory controller 14, interface 18 receives data signals and a data strobe signal from DRAM 12. As described above, such data signals and data strobe signal can conform to the well known BL8, BC4 or other modes. It should be understood that although for purposes of clarity only the operation of one of source synchronous groups 20, 22, etc. is described herein, each of source synchronous groups 20, 22, etc. operates in the same manner.

Figure 2:
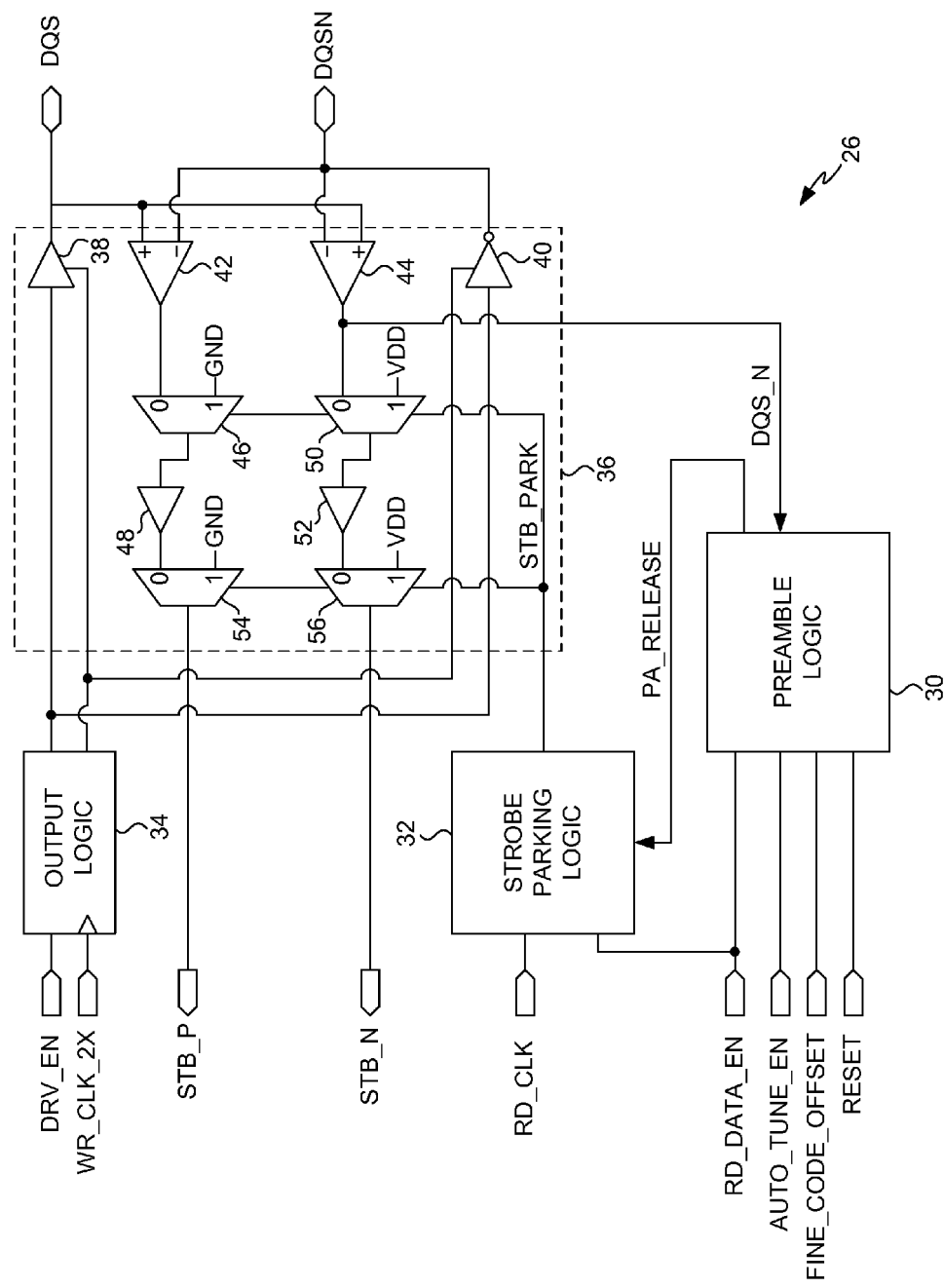
FIG. 2 is a block diagram of a data strobe circuit of the interface of FIG. 1.

As illustrated in FIG. 2, data strobe circuit 26 includes preamble logic 30, data strobe parking logic 32, output logic 34, and a data strobe parking and quarter-cycle (QC) delay circuit 36. Note that the above-referenced data strobe signal comprises differential data strobe signals (DQS and DQSN). Data strobe parking and QC delay circuit 36 serves as the receiver for differential data strobe signals from DRAM 12 (FIG. 1) during a read operation and serves as the transmitter for the differential data strobe signals to DRAM 12 during a write operation.

As the system and method for preamble release training relates to read operations, write operations and related circuitry can be in accordance with conventional principles well understood by persons of ordinary skill in the art. For example, output logic 34 can be configured to receive a drive enable signal (DRV_EN) and a write data signal (WR_DATA) from memory controller 14 during a write operation and also receives a double-frequency clock (WR_CLK_2X). (As well understood in the art, the double-frequency clock has twice the frequency of the clock under which the core logic of ASIC 10 operates, e.g., the logic that initiates read and write operations). As such output logic 34 can be conventional or is otherwise within the capabilities of persons of ordinary skill in the art, it is not described in further detail herein. In response to the drive enable and write enable signals, output logic 34 produces the outgoing data strobe signals via a complementary pair of drivers 38 and 40. Other aspects of interface 18 (FIG. 1) relating to write operations are similarly conventional or otherwise well known to persons of ordinary skill in the art and are therefore not described herein.

In response to a read operation initiated by memory controller 14 (FIG. 1), preamble logic 30 generates a preamble release signal (PA_RELEASE) in the manner described in further detail below. In response to the preamble release signal, data strobe parking logic 32 provides a control signal to data strobe parking and QC delay circuit 36 that un-parks the data strobe signals. Data strobe parking and QC delay circuit 36 receives the differential data strobe signal in the form of true data strobe signal (DQS) and a complementary data strobe signal (DQSN). Each of differential receivers 42 and 44 receives the true data strobe signal and complementary data strobe signal at its true and complementary inputs, respectively. A first multiplexer 46 responsive to a multiplexer control signal (STB_PARK) generated by data strobe parking logic 32 selects either the output of differential receiver 42 or a ground voltage level (GND, representing a logic-0 level) and provides the selected signal to a first QC delay element 48. A second multiplexer 50 responsive to the multiplexer control signal (STB_PARK) selects either the output of differential receiver 44 or a supply voltage level (VDD, representing a logic-1 level) and provides the selected signal to a second QC delay element 52. A third multiplexer 54 responsive to the multiplexer control signal (STB_PARK) selects either the output of first QC delay element 48 or the ground voltage level (i.e., a logic-0 level). A fourth multiplexer 56 responsive to the multiplexer control signal (STB_PARK) selects either the output of second QC delay element 52 or the supply voltage level (i.e., a logic-1 level). The outputs (STB_P and STB_N) of third and fourth multiplexers are provided to data circuits 28 (FIG. 1), which use these signals as the data strobe signals to capture incoming data during the read operation. When the multiplexer control signal (STB_PARK) is in a low or logic-0 state, the incoming data strobe signals are un-parked or allowed to propagate through data strobe parking and QC delay circuit 36 to data circuits 28. However, when the multiplexer control signal (STB_PARK) is in a high or logic-1 state, the incoming data strobe signals are parked by providing data circuits 28 with a fixed logic-0 on the true data strobe signal STB_P and a fixed logic-1 on the complementary data strobe signal STB_N.

Data strobe parking logic 32 generates the above-referenced multiplexer control signal (STB_PARK) to un-park the data strobe signals in response to the preamble release signal (PA_RELEASE) generated by preamble logic 30. As described in further detail below, in the exemplary embodiment this preamble release signal is a pulse. Preamble logic 30 responds to the preamble release signal (pulse) by holding the multiplexer control signal (STB_PARK) in a state to maintain the incoming data strobe signals un-parked for the duration of the incoming data (i.e., one or more bursts). At the end of the incoming data stream, data strobe parking logic 32 changes the multiplexer control signal (STB_PARK) state to re-park the data strobe signals. Data strobe parking logic 32 can use counter circuitry responsive to the data read clock (RD_CLK) produced by memory controller 14 (FIG. 1) and data strobes STB_P and STB_N to determine when the one or more bursts of data have been received. As such strobe parking logic is well known in the art in conventional DRAM memory interfaces, it is not described in further detail herein. An example of suitable strobe parking logic is described in U.S. Pat. No. 8,234,422, the specification of which is incorporated herein in its entirety by this reference.

Figure 3:
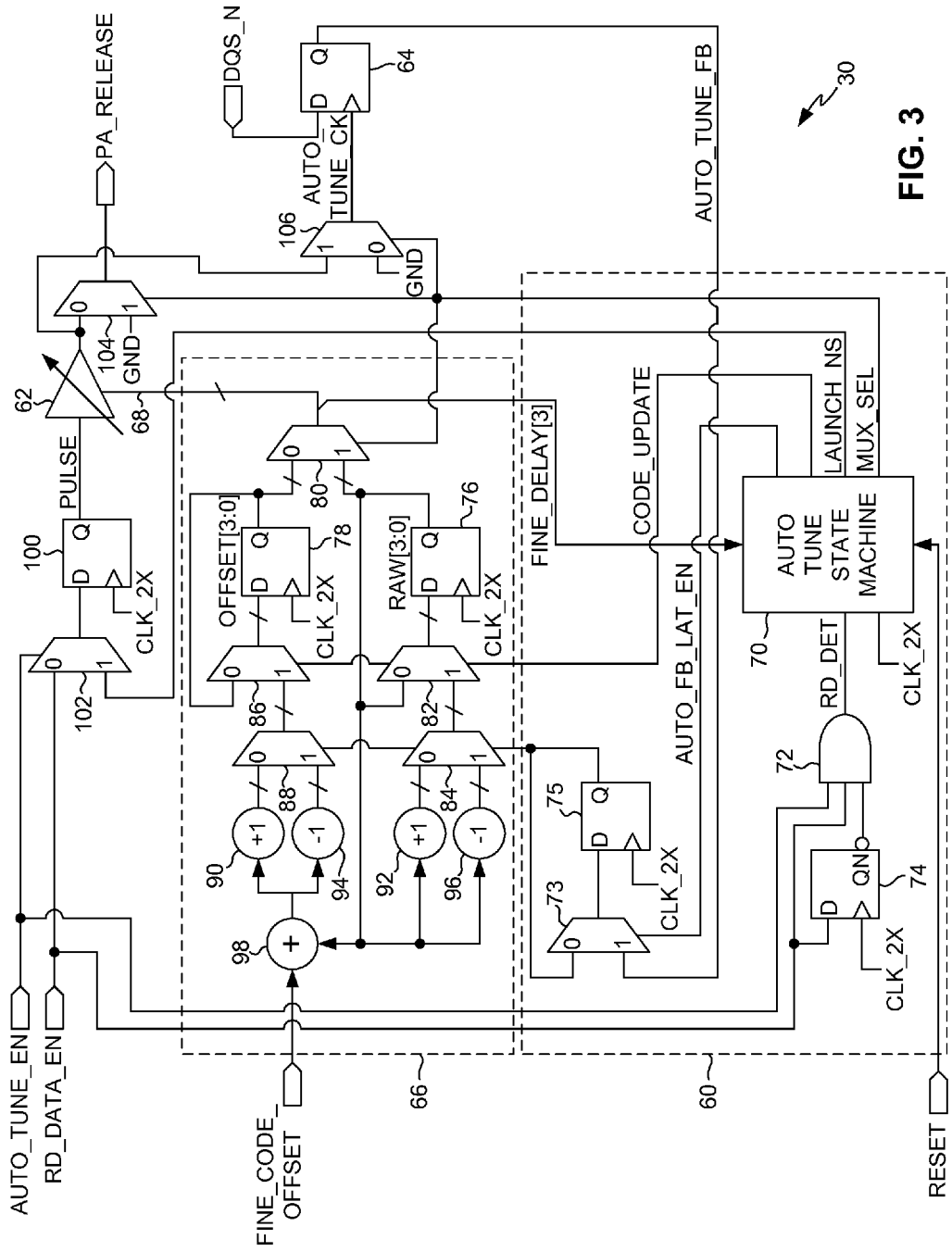
FIG. 3 is a block diagram of preamble logic of the data strobe circuit of FIG. 2.

Preamble logic 30 provides a feedback-based tuning or training feature that adjusts the timing of the preamble release signal (PA_RELEASE) in response to a comparison of the preamble release signal with the data strobe signal received during a prior read operation. As illustrated in FIG. 3, preamble logic 30 includes an auto-tune circuit 60 that generates a first signal and a second signal in response to an initiation of a read operation. As described below, both the first and second signal propagate through circuitry that includes an adjustable delay element 62. Adjustable delay element 62 delays the first signal to produce the preamble release signal (PA_RELEASE). Adjustable delay element 62 delays the second signal to produce an auto-tune clock signal (AUTO_TUNE_CK). A flip-flop 64 serves as a comparator circuit that compares an edge of the auto-tune clock signal with an edge of the data strobe signal associated with incoming data during the read operation. In response to the result (AUTO_TUNE_FB) of this comparison, auto-tune circuit 60 can cause values stored in register circuitry 66 to be adjusted (e.g. incremented or decremented). Register circuitry 66 provides the stored values to adjustable delay element 62 as a delay adjustment signal 68 (FINE_DELAY[2:0]). It should be understood that although in the exemplary embodiment the first and second signals propagate through the same adjustable delay element 62, in other embodiments (not shown) the first signal can propagate through a first adjustable delay element and the second signal can propagate through a second adjustable delay element. More generally, the adjustable delay circuit through which the first and second signals propagate can comprise any number of adjustable delay elements.

Auto-tune circuit 60 is based on a state machine 70 that operates in response to a read-detect signal (RD_DET). The read-detect signal is generated in response to the read data enable signal (RD_DATA_EN) that memory controller 14 (FIG. 1) activates during read operations. More specifically, the read-detect signal is a pulse generated by an AND gate 72 that forms the logical AND of the read data enable signal, a complementary output of a flip-flop 74 that receives the read data enable signal, and an auto-tune enable signal (AUTO_TUNE_EN). Training controller 16 can use the auto-tune enable signal to enable (or disable) the preamble release auto-tune training feature. Auto-tune circuit 60 further includes a multiplexer 73 and a flip-flop 75 that are used to increment or decrement the values stored in register circuitry 66 in response to an auto-tune feedback latch enable signal (AUTO_FB_LAT_EN) generated by state machine 70.

Register circuitry 66 includes a first register 76 and a second register 78. Training controller 16 (FIG. 1) can load first and second registers 76 and 78 with initial values, although circuitry to effect such register loading is not shown for purposes of clarity. Register circuitry 66 further includes an output multiplexer 80 that, in response to a multiplexer selection signal (MUX_SEL) generated by state machine 70, selects either the output of first register 76 or the output of second register 78 and provides three bits of the selected output as the above-referenced delay adjustment signal 68 (FINE_DELAY[2:0]). The most-significant bit (FINE_DELAY[3]) of delay adjustment signal 68 is provided as an input to state machine 70. Register circuitry 66 also includes a first register first multiplexer 82 and a first register second multiplexer 84, as well as a second register first multiplexer 86 and a second register second multiplexer 88. Multiplexers 82 and 86 operate in response to a code update selection signal (CODE_UPDATE) generated by state machine 70 to cause registers 76 and 78 to either maintain their values or update (i.e., adjust) their values. Multiplexers 84 and 88 operate in response to the auto-tune feedback latch enable signal generated by state machine 70 (via multiplexer 73 and a flip-flop 75) to either increment or decrement the values in registers 76 and 78 when registers 76 and 78 are updated. Two incrementing circuits 90 and 92 and two decrementing circuits 94 and 96 facilitate this procedure by providing pre-incremented or pre-decremented values to multiplexers 84 and 88. Thus, the output of first register 76 is either incremented or decremented to form the value with which first register 76 is to be updated. An adder 98 adds a fine offset (FINE_CODE_OFFSET) to the output of first register 76 to form the value with which second register 78 is to be updated. That is, while first register 76 is updated by incrementing or decrementing the current value in first register 76, second register 78 is updated by incrementing or decrementing the current value in first register 76 and adding a fine offset. Training controller 16 can provide this fine offset. Incrementing circuits 90 and 92, decrementing circuits 94 and 96, and adder circuit 98 are configured to prevent the values stored in registers 76 and 78 from rolling over. Thus, for example, a value of "1111" (binary) stored in registers 76 and 78 remains "1111" despite an attempt to update the values by incrementing them by one.

The above-referenced first signal and second signal that auto-tune circuit 60 generates in response to an initiation of a read operation are generated by state machine 70. More specifically, the first signal is produced in response to a first occurrence of state machine 70 activating a launch-next-state (LAUNCH_NS) signal, and the second signal is produced in response to a second occurrence of state machine 70 activating the launch-next-state signal. A flip-flop 100 receives the launch-next-state signal via a multiplexer 102 and generates the first and second signals in the form of pulses. As described above, the first and second signals (pulses) are input to adjustable delay element 62.

A multiplexer 104 operates in response to the multiplexer selection signal (MUX_SEL) generated by state machine 70. State machine 70 sets the multiplexer selection signal to a logic-0 state during the time interval following the initiation of a read operation but preceding the incoming data burst, thereby selecting the output of adjustable delay element 62. During this time interval, state machine 70 also causes the above-referenced first signal to be produced. Accordingly, the output of adjustable delay element 62 (i.e., the delayed first signal) serves as the preamble release signal (PA_RELEASE) during this time interval.

State machine 70 sets the multiplexer selection signal to a logic-1 state during the time interval in which the data burst is being received (and thus the data strobe signal is actively transitioning state). The other input of multiplexer 104 is tied to ground. Accordingly, the ground or logic-0 level is selected instead of the output of adjustable delay element 62. Thus, the preamble release signal remains at a logic-0 level during this latter time interval. However, during this latter time interval when the multiplexer selection signal has a logic-1 state, another multiplexer 106 selects the output of adjustable delay element 62 as the input to flip-flop 64. During this time interval, state machine 70 also causes the above-referenced second signal to be produced. The output of adjustable delay element 62 is the delayed second signal. Flip-flop 64 compares edges of the delayed second signal with edges of the data strobe signal associated with the incoming data burst, and provides the result of the comparison to auto tune circuit 60 in the form of the auto-tune feedback signal (AUTO_TUNE_FB).

Figure 4:
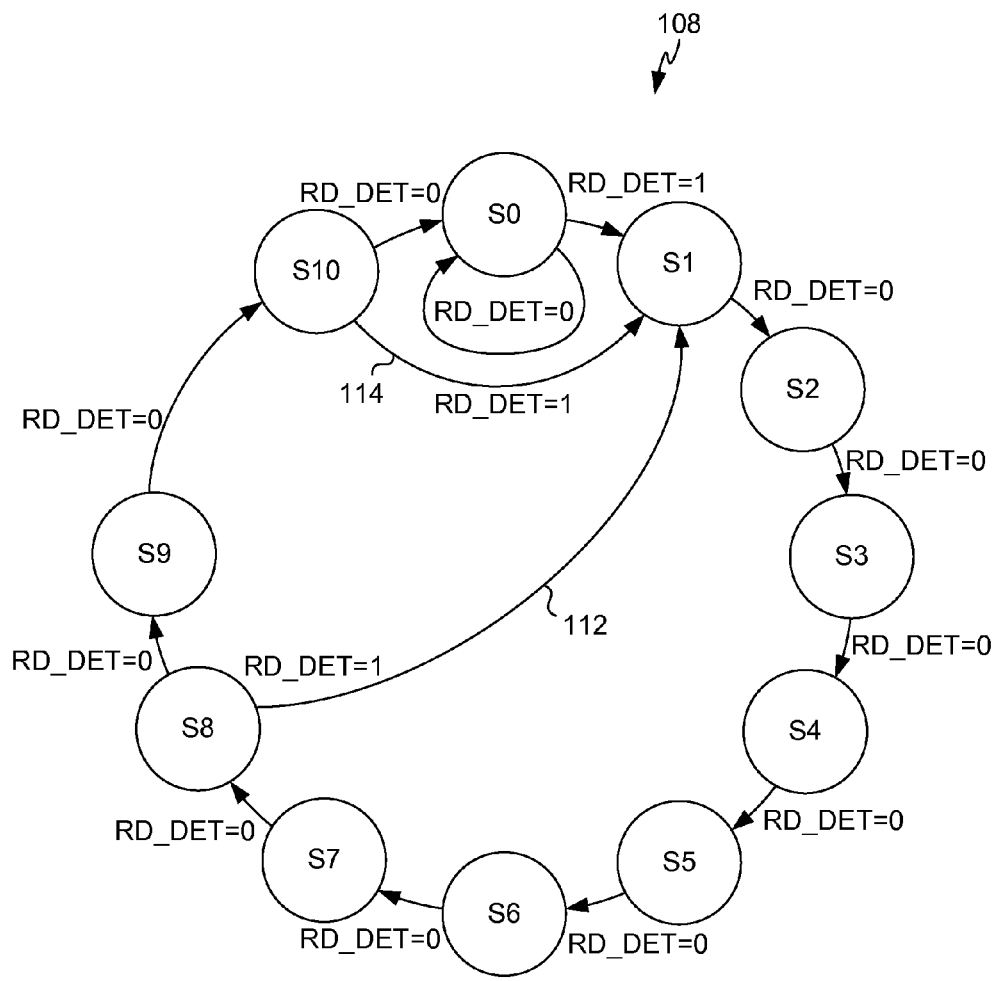
FIG. 4 is a state diagram for the state machine of the preamble logic of FIG. 3.

State machine 70 can be structured in accordance with the state diagram 108 of FIG. 4 and the table of FIGS. 5A-5B. As illustrated in FIG. 4, state machine 70 can have the following states: S0, S1, S2, S3, S4, S5, S6, S7, S8, S9, S10. State machine 70 receives the above-described read detect signal (RD_DET) and a clock signal (CLK_2X) as inputs. State machine 70 also receives the most-significant bit (FINE_DELAY[3]) of the above-described delay adjustment signal 68 as another input. Note in FIGS. 5A-5B that state machine 70 generates the launch-next-state signal (LAUNCH_NS) in response to (i.e., as a function of) the current state, the read detect signal (RD_DET), and the most-significant bit (FINE_DELAY[3]) of delay adjustment signal 68. State machine 70 generates the multiplexer selection signal (MUX_SEL), the auto-tune feedback latch enable signal (AUTO_FB_LAT_EN), and the code update signal (CODE_UPDATE) in response to the current state. State machine 70 transitions from its current state to its next state in response to its current state and the read detect signal.

State S0 is an idle state. In response to the read detect signal transitioning from logic-0 to logic-1, state machine 70 transitions from state S0 to state S1. In response to the read detect signal transitioning to a logic-0 state and remaining in a logic-0 state for successive clock cycles following the transition to state S1, state machine 70 transitions to states S2, S3, S4, S5, S6, S7 and S8, respectively, in synchronism with incoming data words of the burst. In some instances, two read operations may occur consecutively with minimal or near-minimal time separation between them. For example, if the read detect signal transitions from logic-0 to logic-1 while state machine 70 is in state S8, then state machine 70 makes a transition 112 from state S8 back to state S1. However, if the read detect signal remains in a logic-0 state while state machine 70 is in state S8, then state machine 70 transitions from state S8 to state S9 and then to state S10 on successive clock cycles. If the read detect signal transitions from logic-0 to logic-1 while state machine 70 is in state S10, indicating that two read operations occurred consecutively with near-minimal time separation between them, then state machine 70 makes a transition 114 from state S10 to state S1. Otherwise, if the read detect signal remains in a logic-0 state while state machine 70 is in state S10, then state machine 70 transitions from state S10 back to state S0 (i.e., the idle state). If state machine 70 receives a reset signal (RESET) at any time, it transitions to state S0. Persons skilled in the art will understand that for purposes of clarity the state diagram of FIG. 4 does not include invalid states, invalid input transitions, or other error conditions.

As illustrated in FIGS. 6-13, state machine 70 can respond to the initiation of various types of read operations by memory controller 14 (FIG. 1). In each of the following examples, memory controller 14 initiates the read operation or operations by issuing a read enable (RD_DATA_EN) signal to interface 18, as well as issuing associated commands to command and control logic 24 (FIG. 1) of interface 18. The read enable signal is latched in flip-flop 74 (RD_DATA_EN_REG).

The timing diagram 116 of FIG. 6 illustrates an example of a read operation of a type commonly referred to as "burst length 8" or "BL8," in which a burst of eight data words follows the preamble (i.e., DQS in a logic-0 state). The data words (not shown for purposes of clarity) are received by interface 18 in synchronism with rising edges of both data strobe signals (DQS and DQSN). A post-amble (i.e., DQS in a logic-0 state) follows the eight data words.

Figure 7:
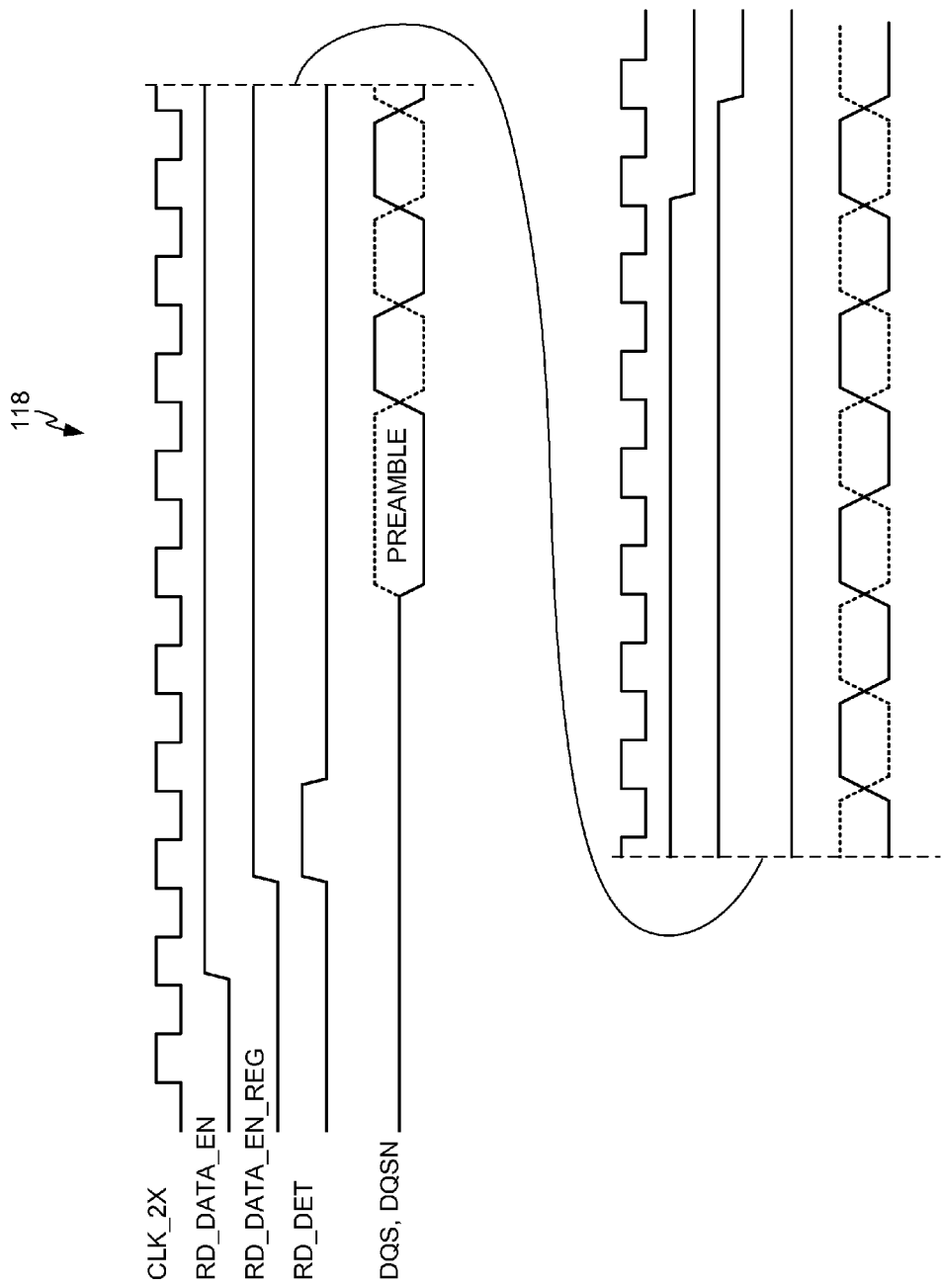
FIG. 7 is a timing diagram illustrating a second exemplary read operation event.

The timing diagram 118 of FIG. 7 illustrates another example of read operations to which state machine 70 can respond. In this example, two consecutive BL8 read operations are initiated. Although not shown for clarity, persons skilled in the art can appreciate that this example represents memory controller 14 issuing two column address strobe or "CAS" commands that are spaced only four clock cycles apart. In this instance, the term "clock cycle" refers to the main clock signal or "CLK_1X" under which memory controller 14 and the core logic of ASIC 10 operate, in contrast with the clock signal (CLK_2X) shown in FIG. 3 that has a frequency twice the frequency of the main clock signal (CLK_1X). Note that in this example, the read burst is effectively a single burst of 16 data words, with a preamble (PREAMBLE) occurring at the beginning of the burst and a post-amble (POST.) occurring at the end of the burst. Note that the postamble does not appear in the timing diagram 118 until a cycle subsequent to those shown. In this example, the input RD_DATA_EN of timing diagram 118 of FIG. 7 differs from the input RD_DATA_EN of timing diagram 116 of FIG. 6, but both examples produce the same response on the RD_DET signal. Since the RD_DET input to state machine 70 is exactly the same in both examples, state machine 70 responds in the same manner in both examples.

Figure 8:
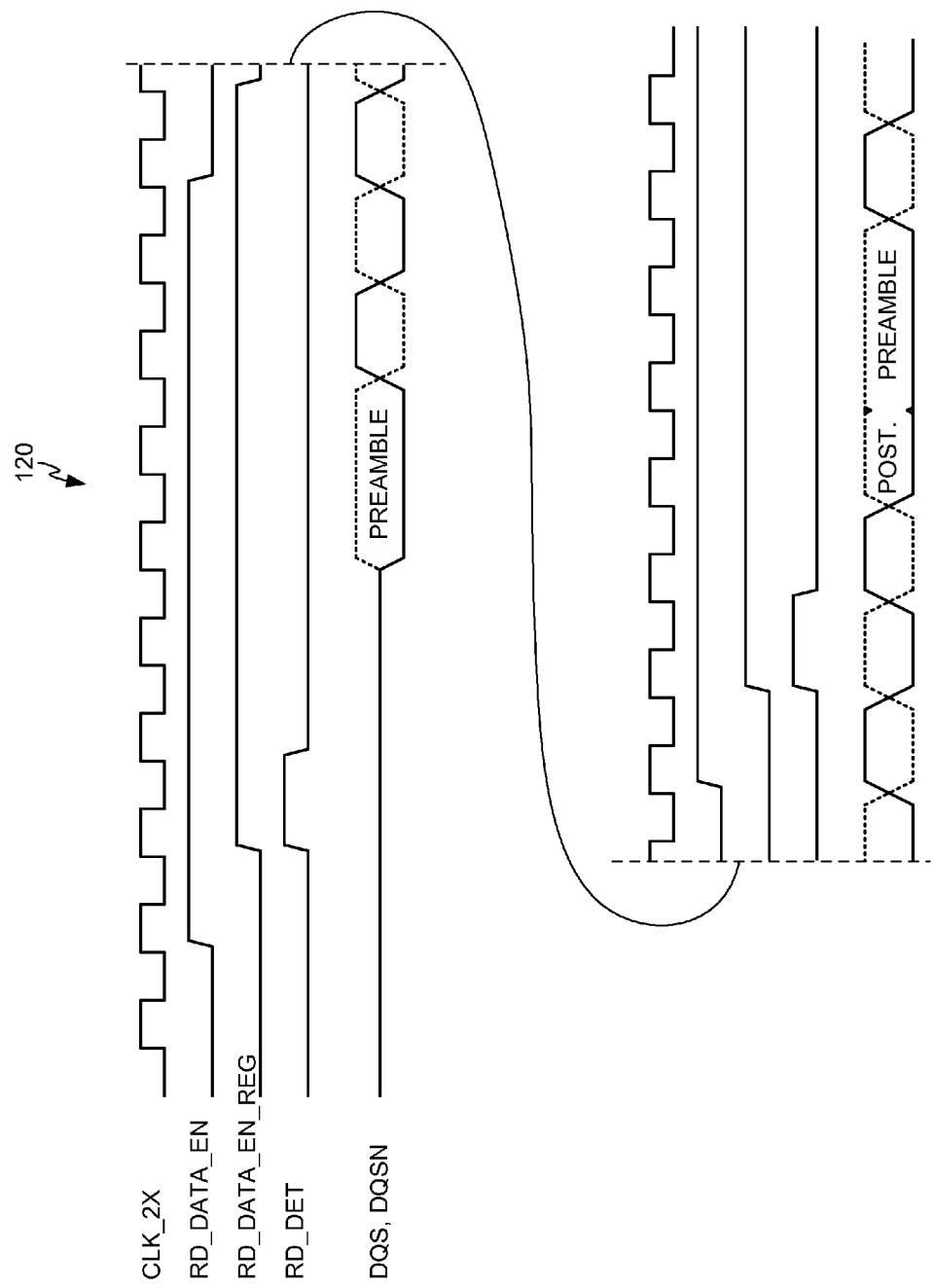
FIG. 8 is a timing diagram illustrating a third exemplary instance of operation of the preamble logic.

The timing diagram 120 of FIG. 8 is similar to timing diagram 118 of FIG. 7 but represents memory controller 14 issuing two CAS commands that are spaced five clock cycles (CLK_1X) apart. As described in further detail below, transition 114 of state diagram 108 (FIG. 4) relates to this type of read operation where two consecutive CAS commands are spaced five clock cycles (CLK_1X) apart.

Figure 9:
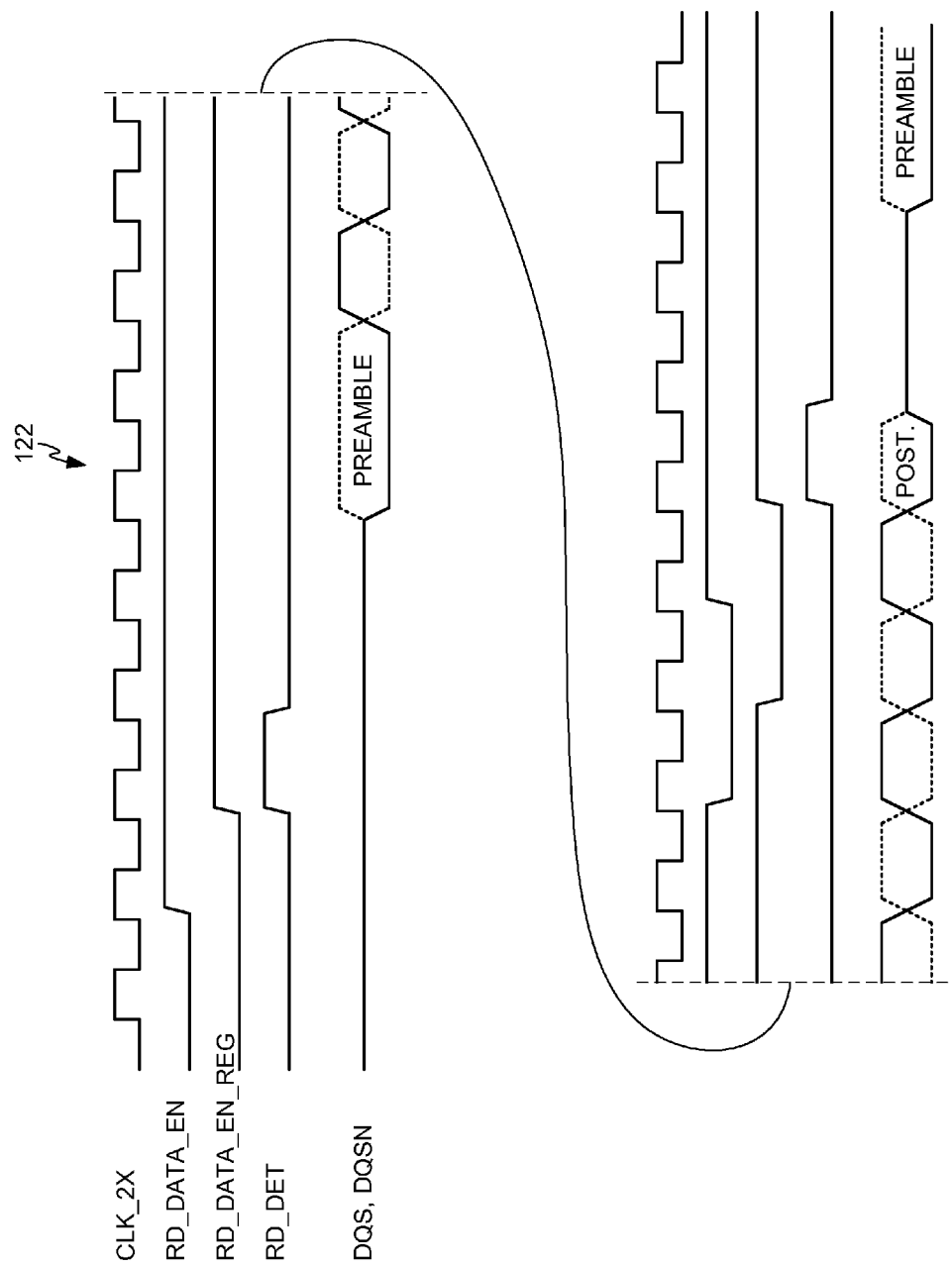
FIG. 9 is a timing diagram illustrating a fourth exemplary read operation event.

The timing diagram 122 of FIG. 9 is similar to timing diagrams 118 and 120 but represents memory controller 14 issuing two CAS commands that are spaced six clock cycles (CLK_1X) apart. State machine 70 does not include any special state transitions to respond to such a pair of consecutive read operations because they are spaced sufficiently far apart to accommodate a post-amble preceding the preamble of the second read operation.

Figure 10:
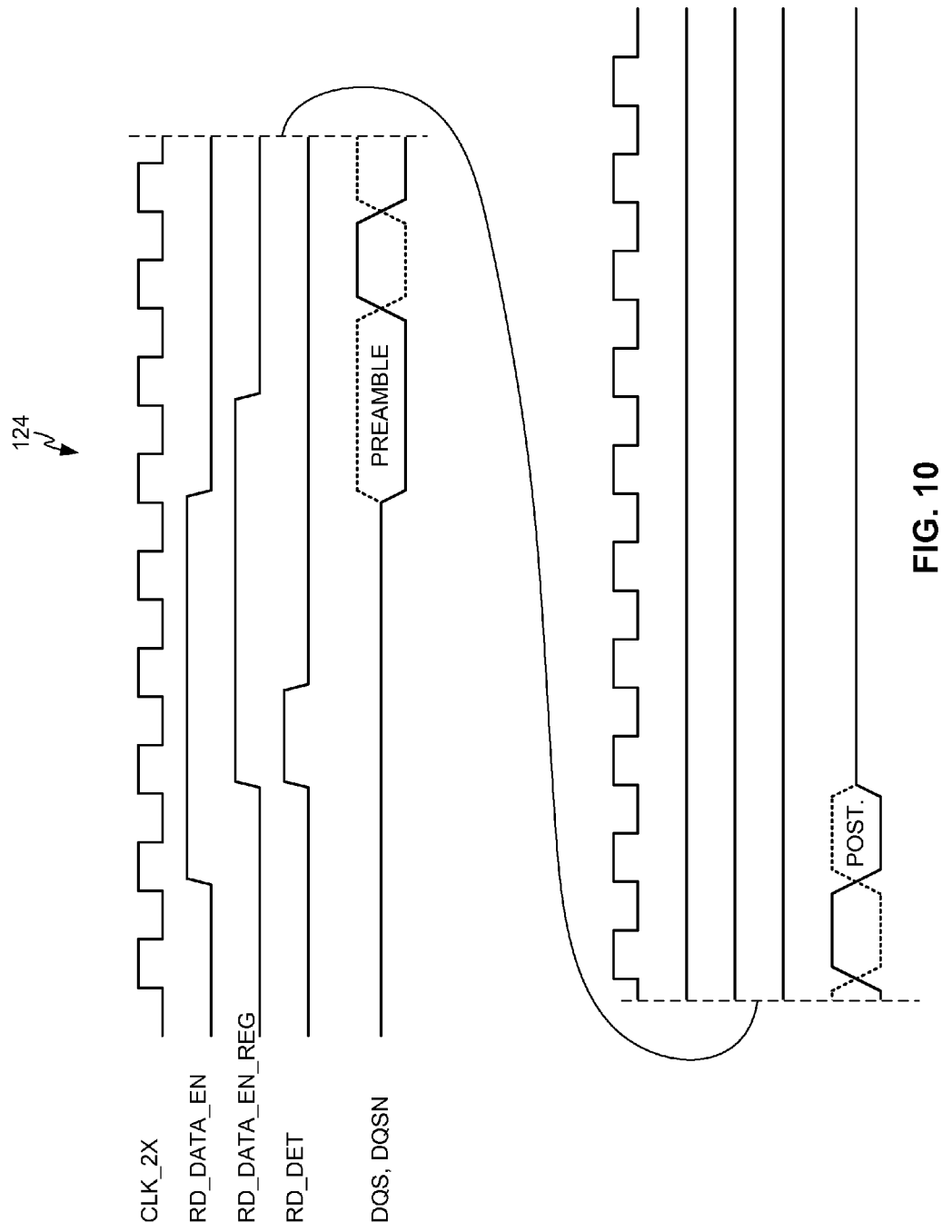
FIG. 10 is a timing diagram illustrating a fifth exemplary read operation event.
Figure 11:
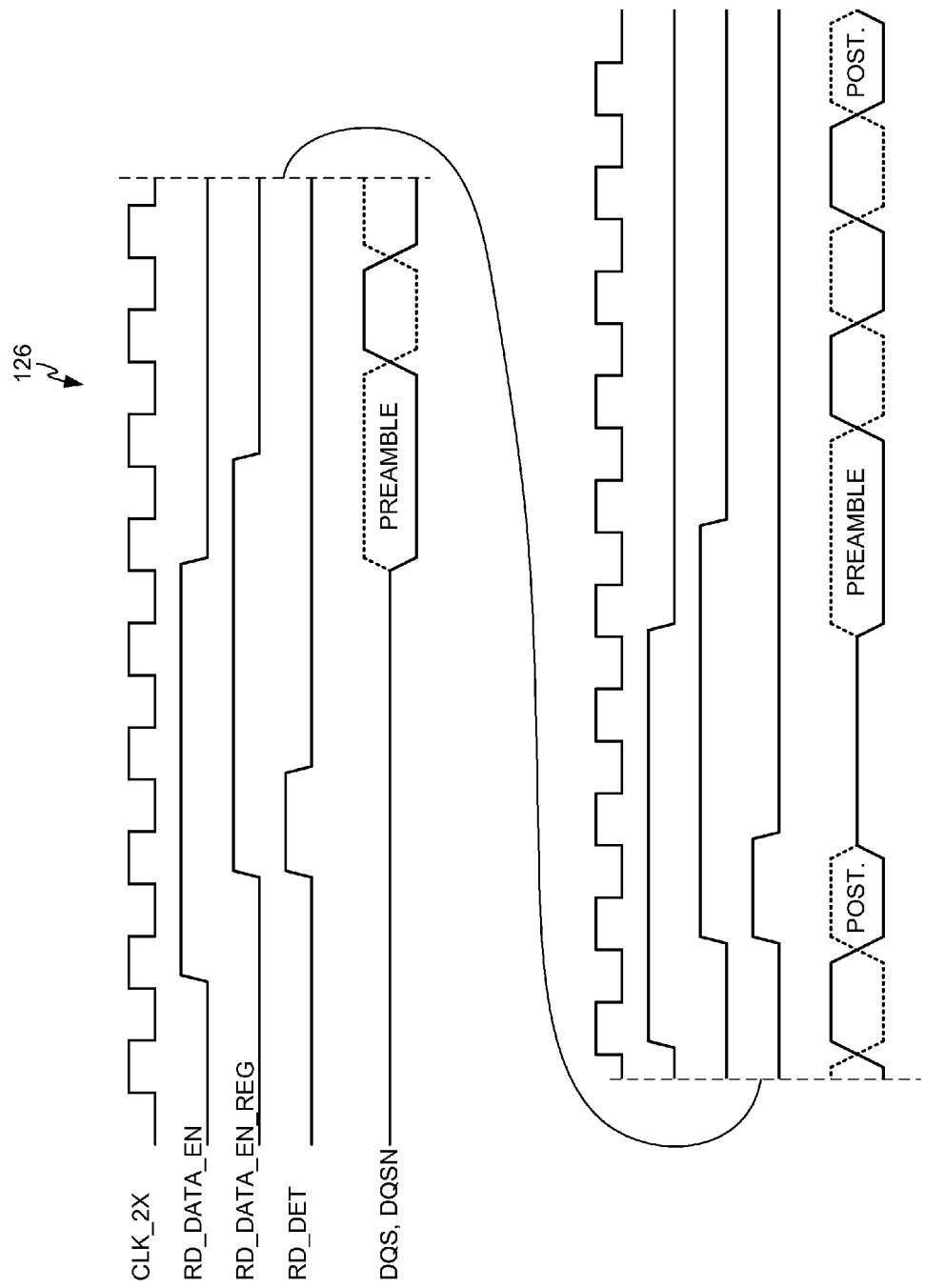
FIG. 11 is a timing diagram illustrating a sixth exemplary read operation event.
Figure 12:
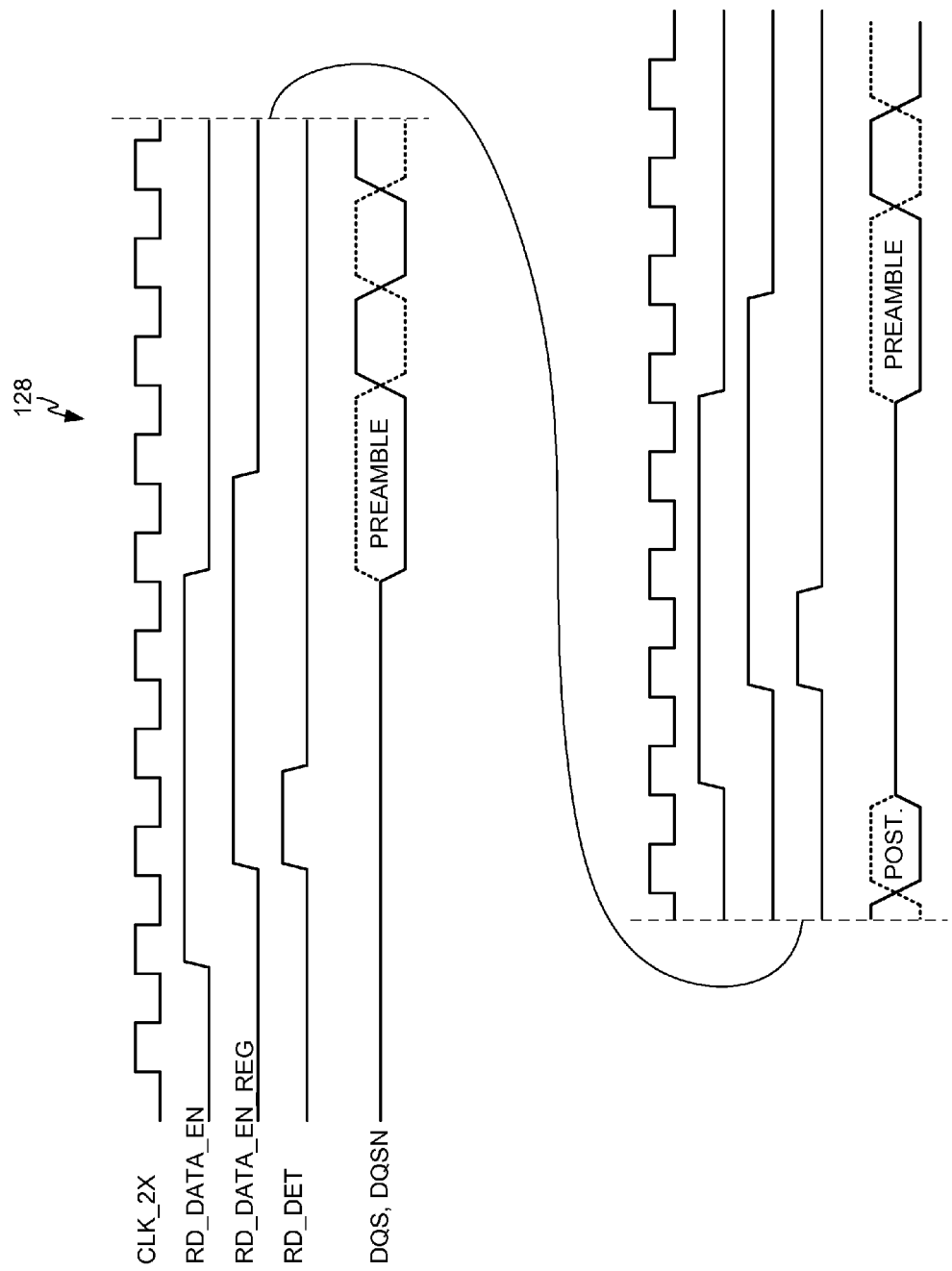
FIG. 12 is a timing diagram illustrating a seventh exemplary read operation event.
Figure 13:
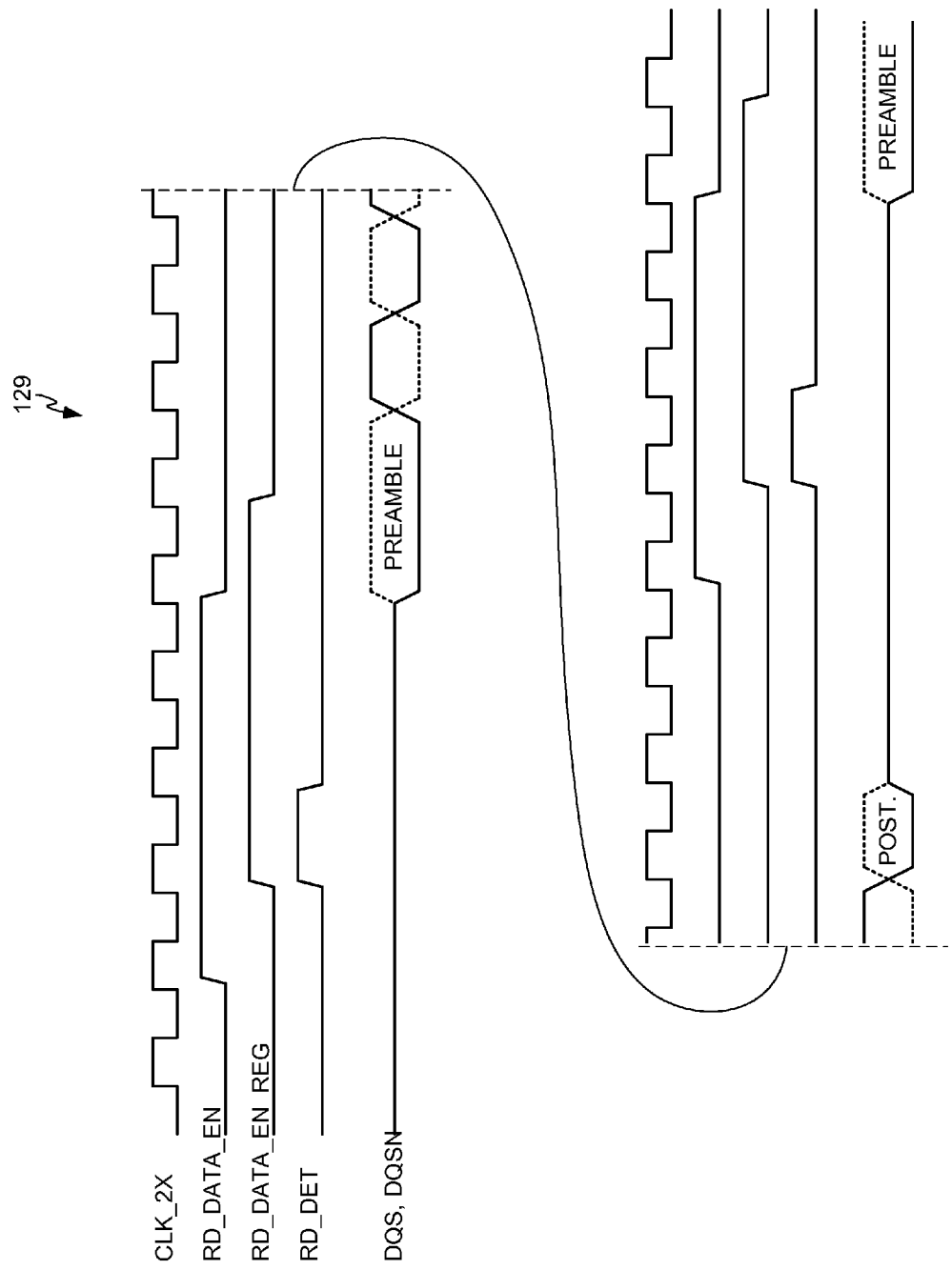
FIG. 13 is a timing diagram illustrating an eighth exemplary read operation event.

The timing diagram 124 of FIG. 10 illustrates still another example of read operations to which state machine 70 can respond. In this example, the read operation is of a type commonly referred to as "burst chop 4" or "BC4," in which a burst of four data words follows the preamble. The timing diagram 126 of FIG. 11 illustrates an example in which two consecutive BC4 read operations are initiated. Although not shown for clarity, persons skilled in the art can appreciate that this example represents memory controller 14 issuing two CAS commands that are spaced only four clock cycles (CLK_1X) apart. The timing diagram 128 of FIG. 12 is similar to timing diagram 126 but represents memory controller 14 issuing two CAS commands that are spaced five clock cycles (CLK_1X) apart. The timing diagram 129 of FIG. 13 is similar to timing diagrams 126 and 128 but represents memory controller 14 issuing two CAS commands that are spaced six clock cycles (CLK_1X) apart.

Figure 14A:
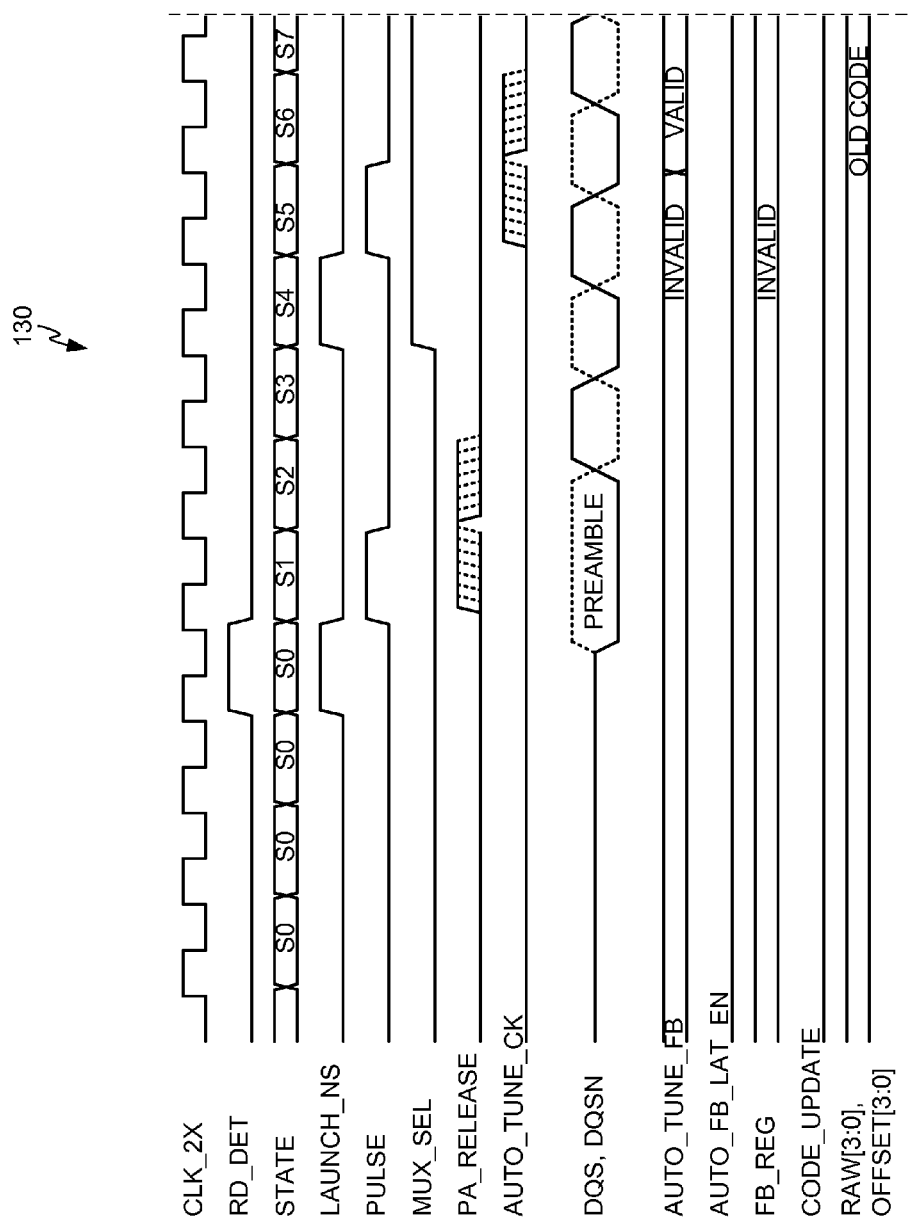
FIG. 14A is a portion of a timing diagram illustrating a first exemplary instance of the operation of the preamble logic.
Figure 14B:
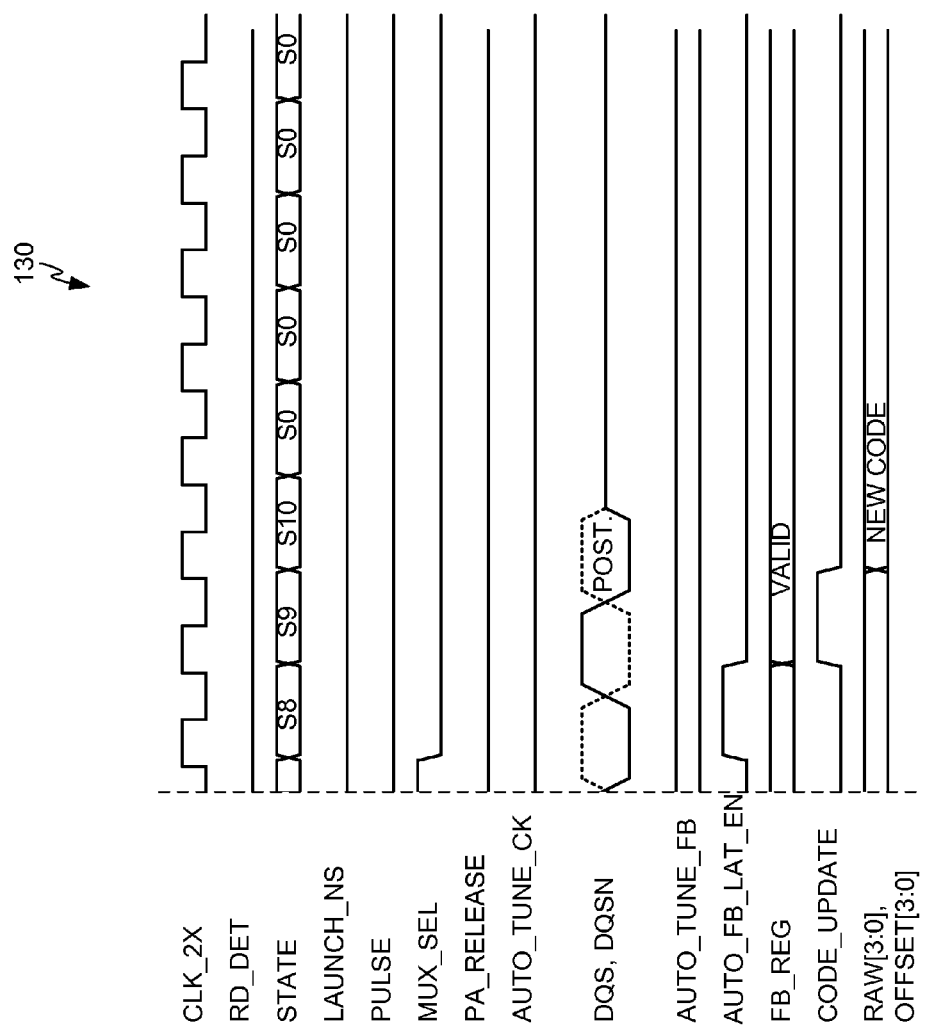
FIG. 14B is a continuation of the timing diagram of FIG. 14A.

The timing diagram 130 of FIGS. 14A-14B illustrates the manner in which state machine 70 and other portions of preamble logic 30 respond to a BL8 read operation, where the most-significant bit of the delay value (RAW[3:0] and OFFSET[3:0]) stored in registers 76 and 78 (FIG. 3), respectively, is a logic-0. With further reference to state diagram 108 (FIG. 4), note that state machine 70 proceeds through the sequence of states: S0, S1, S2, S3, S4, S5, S6, S7, S8, S9, S10, S0. Also note in timing diagram 130 that the outputs of state machine 70, i.e., LAUNCH_NS, MUX_SEL, AUTO_FB_LAT_EN and CODE_UPDATE, respond to the inputs to state machine 70, including CLK_2X and RD_DET, in the manner indicated by the table of FIGS. 5A-5B. The most-significant bit of the delay value (FINE_DELAY[3:0]) is not shown in timing diagram 130 for purposes of clarity, but it has a logic-0 value throughout the read operation. Also note that the output of preamble logic 30 (FIG. 3), the preamble release signal (PA_RELEASE), has transitions or edges that occur within a range determined by the operation of the preamble release training (or auto-tuning) feature described herein. As described above, in the exemplary embodiment the auto-tuning or training feature operates to adjust, i.e., selectably delay, the edges of the preamble release signal (PA_RELEASE) in response to the result flip-flop 64 (FIG. 3) comparing edges of the above-referenced second signal (the delayed second signal is referred to as AUTO_TUNE_CK in the exemplary embodiment) with edges of one of the data strobe signals (DQSN). The amount by which preamble logic 30 adjusts the preamble release signal is determined by the delay value contained in registers 76 and 78 at the time the preamble release signal is generated. As also described above, the foregoing comparison occurs during a read operation preceding the adjustment, such as the read operation illustrated by timing diagram 130. The auto-tune feedback signal (AUTO_TUNE_FB) representing the result of the comparison is provided to flip-flop 75, which serves as a feedback register, via multiplexer 73. Note that timing diagram 130 indicates when the contents of flip-flop 75 (FB_REG) represent valid feedback (i.e., VALID versus INVALID). Timing diagram 130 further indicates when registers 76 and 78 have been updated with new delay values (NEW CODE versus OLD CODE) in response to the comparison.

Figure 15A:
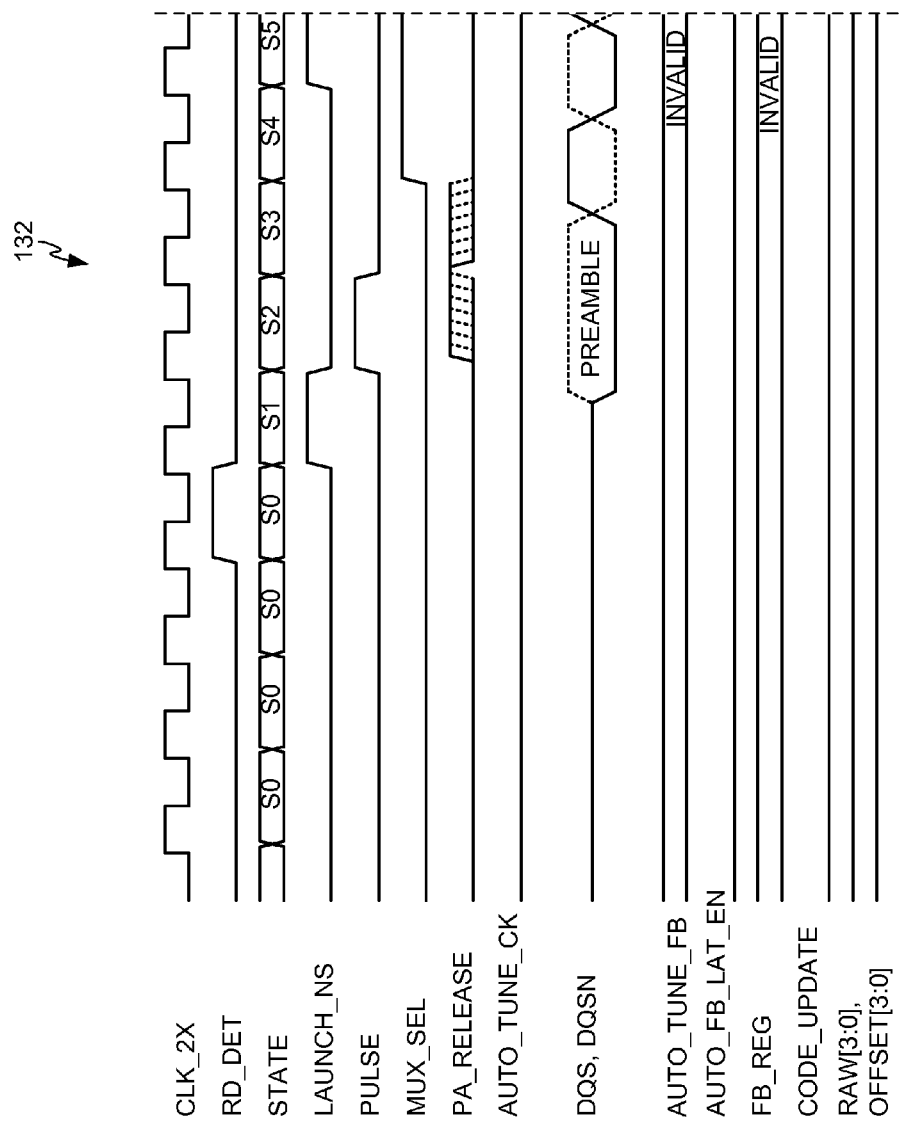
FIG. 15A is a portion of a timing diagram illustrating a first exemplary instance of the operation of the preamble logic.
Figure 15B:
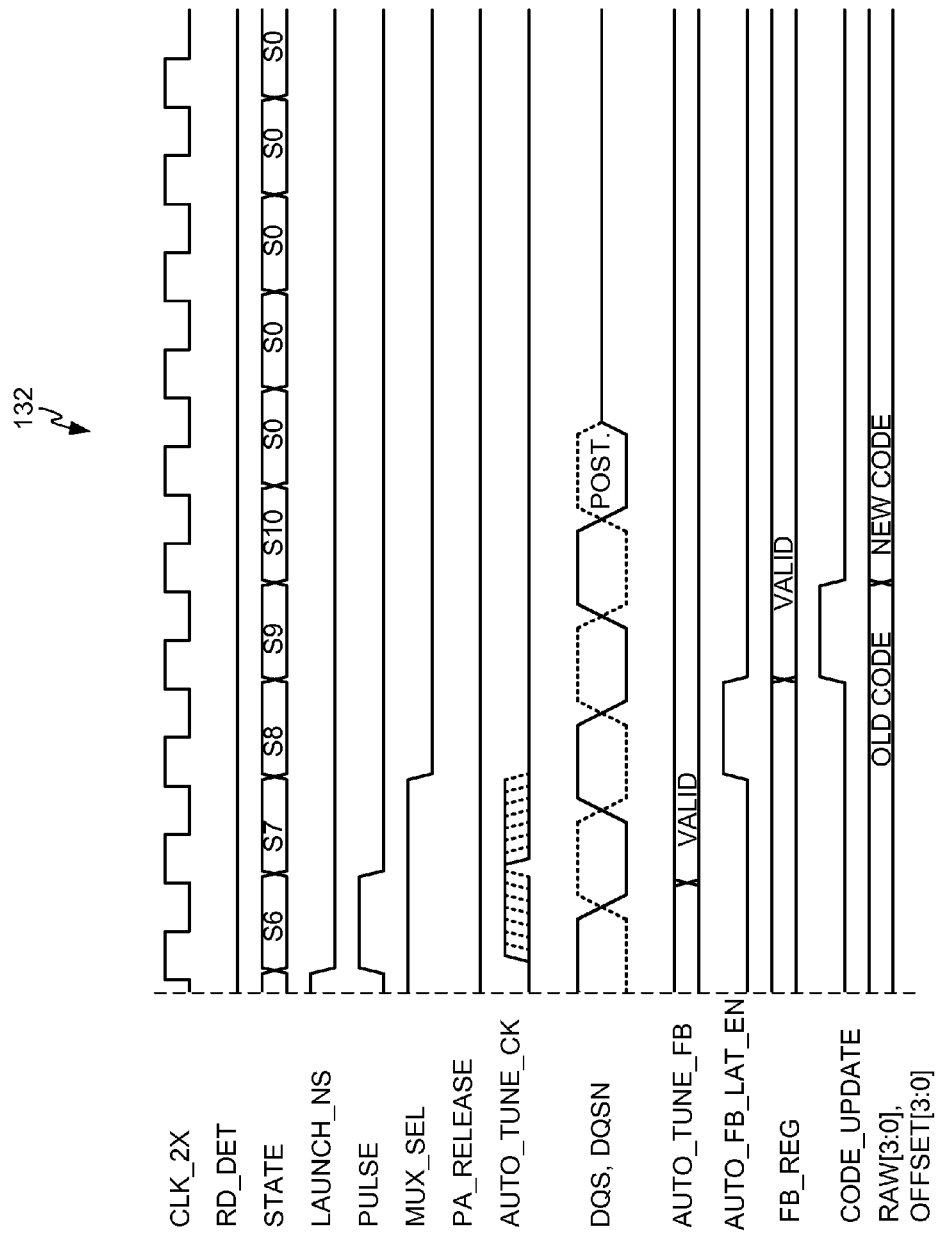
FIG. 15B is a continuation of the timing diagram of FIG. 15A.

The timing diagram 132 of FIGS. 15A-15B illustrates the manner in which state machine 70 and other portions of preamble logic 30 respond to a BL8 read operation, where the most-significant bit of the delay value (RAW[3:0] and OFFSET[3:0]) stored in registers 76 and 78 (FIG. 3), respectively, is a logic-1. With further reference to state diagram 108 (FIG. 4), note that state machine 70 proceeds through the sequence of states: S0, S1, S2, S3, S4, S5, S6, S7, S8, S9, S10, S0. As in the preceding timing diagram 130, the outputs of state machine 70, i.e., LAUNCH_NS, MUX_SEL, AUTO_FB_LAT_EN and CODE_UPDATE, respond to the inputs to state machine 70, including CLK_2X and RD_DET, in the manner indicated by the table of FIGS. 5A-5B. The most-significant bit of the delay value (FINE_DELAY[3:0]) is not shown in timing diagram 132 for purposes of clarity, but it has a logic-1 value throughout the read operation. As in the preceding timing diagram 130, the output of preamble logic 30 (FIG. 3), the preamble release signal (PA_RELEASE), has transitions or edges that occur within a range determined by the operation of the preamble release training (or auto-tuning) feature described herein.

Figure 16A:
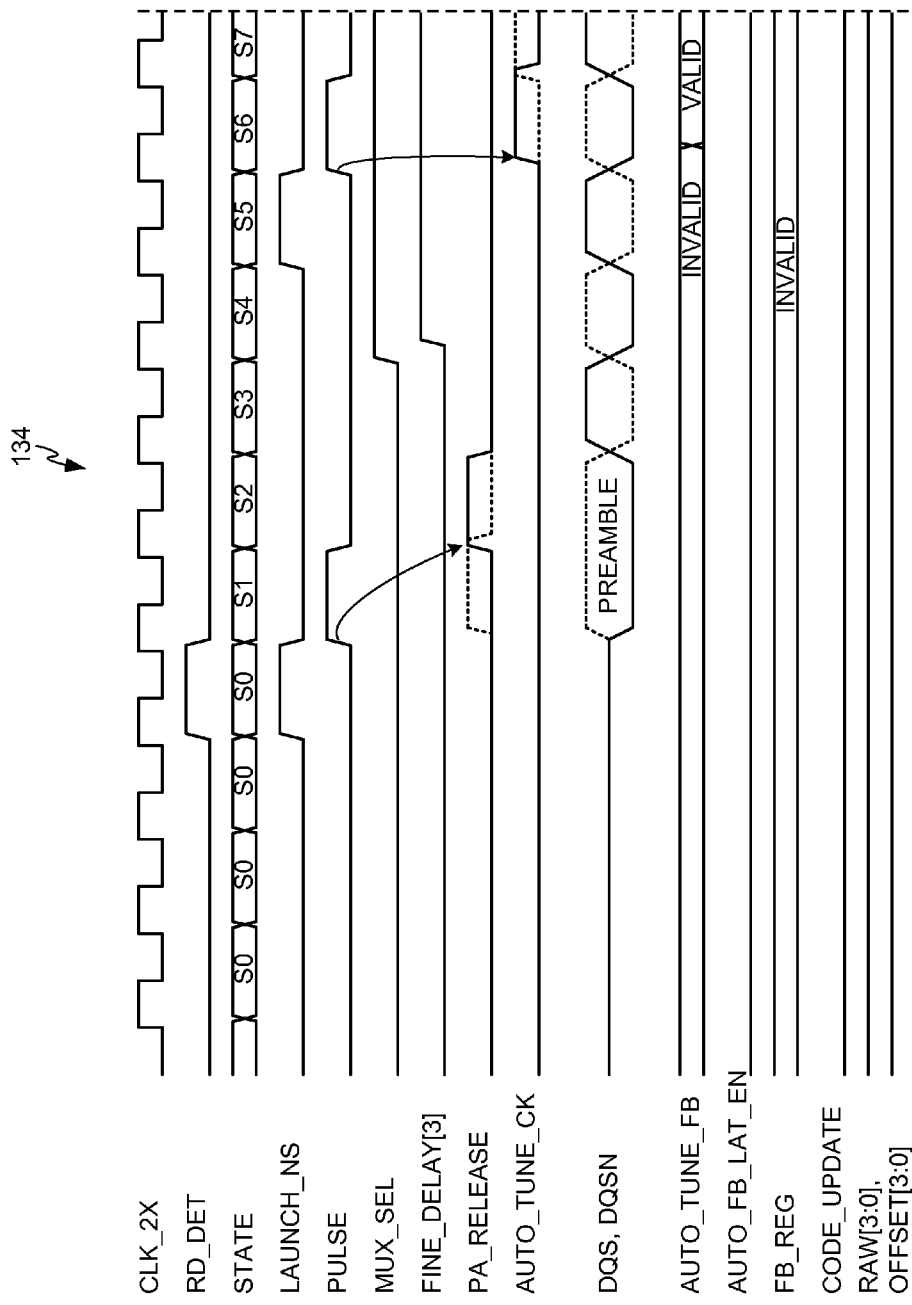
FIG. 16A is a portion of a timing diagram illustrating a first exemplary instance of the operation of the preamble logic.
Figure 16B:
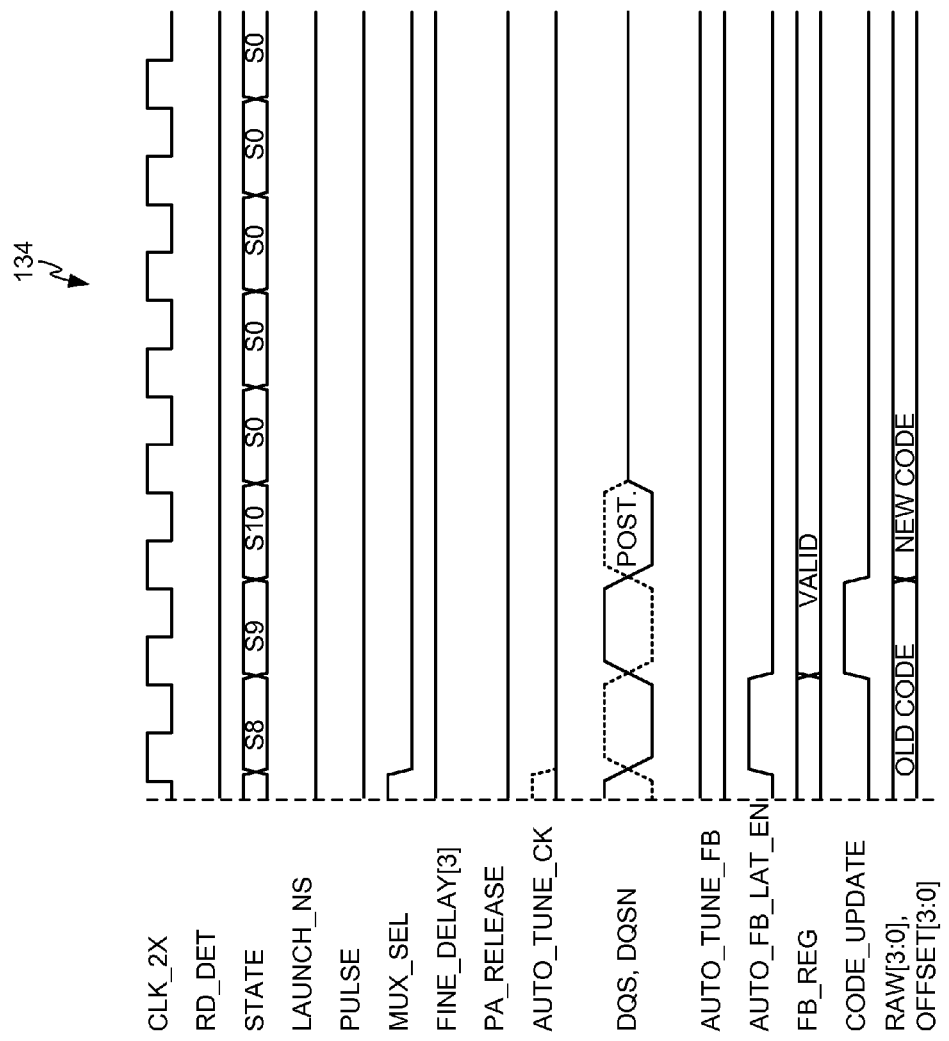
FIG. 16B is a continuation of the timing diagram of FIG. 16A.

The timing diagram 134 of FIGS. 16A-16B illustrates the manner in which state machine 70 and other portions of preamble logic 30 respond to a BL8 read operation, where the most-significant bit of the delay value (RAW[3:0] and OFFSET[3:0]) stored in registers 76 and 78 (FIG. 3), respectively, transitions from a logic-0 to a logic-1 during the read operation. This transition occurs in response to an offset value less than zero being present on the FINE_CODE_OFFSET input to register circuit 66 (FIG. 3), causing register 78 to hold a most-significant bit with a value of logic-0 and register 76 to hold a most-significant bit with a value of logic-1. With further reference to state diagram 108 (FIG. 4), note that state machine 70 proceeds through the sequence of states: S0, S1, S2, S3, S4, S5, S6, S7, S8, S9, S10, S0.

Figure 17A:
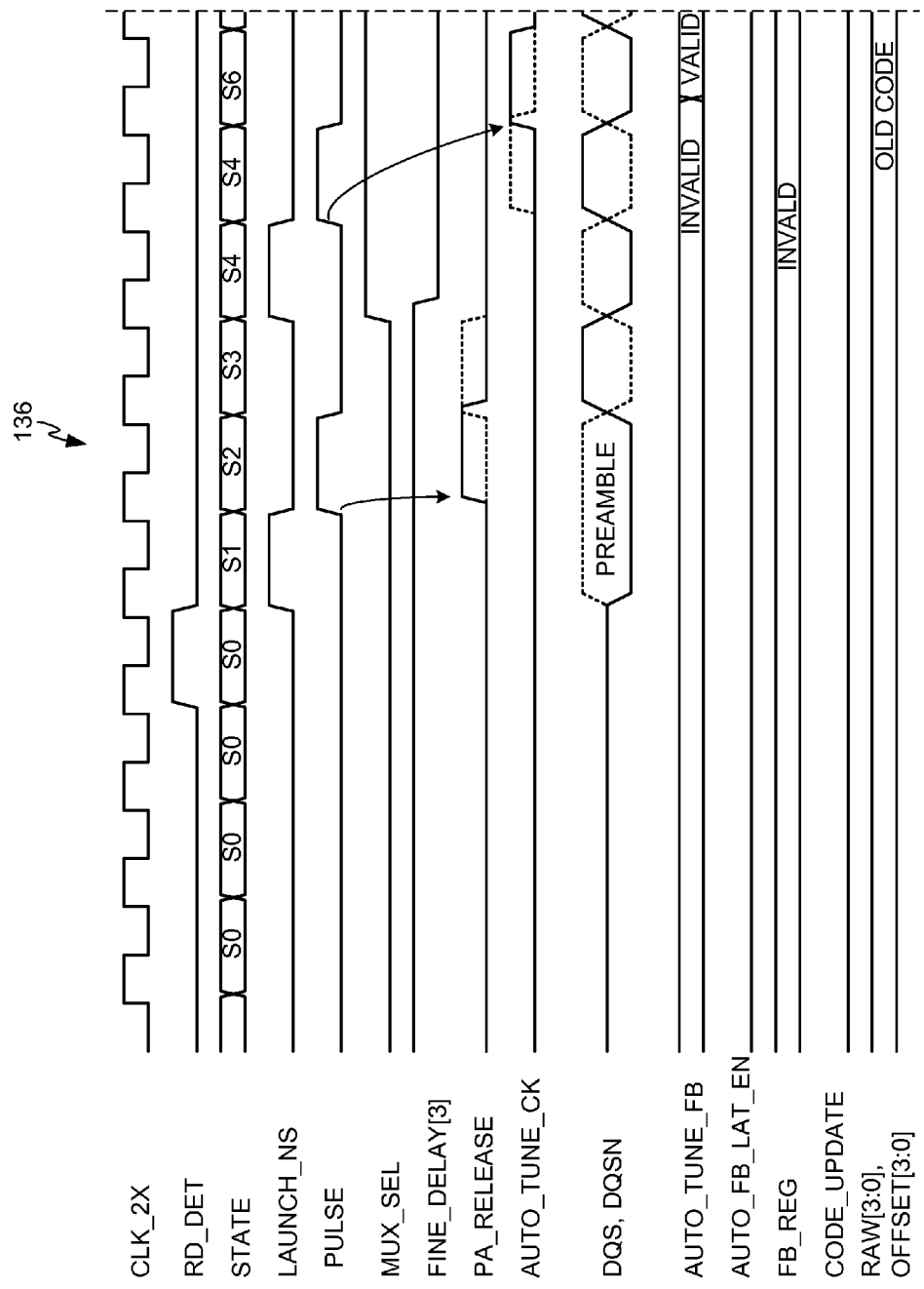
FIG. 17A is a portion of a timing diagram illustrating a first exemplary instance of the operation of the preamble logic.
Figure 17B:
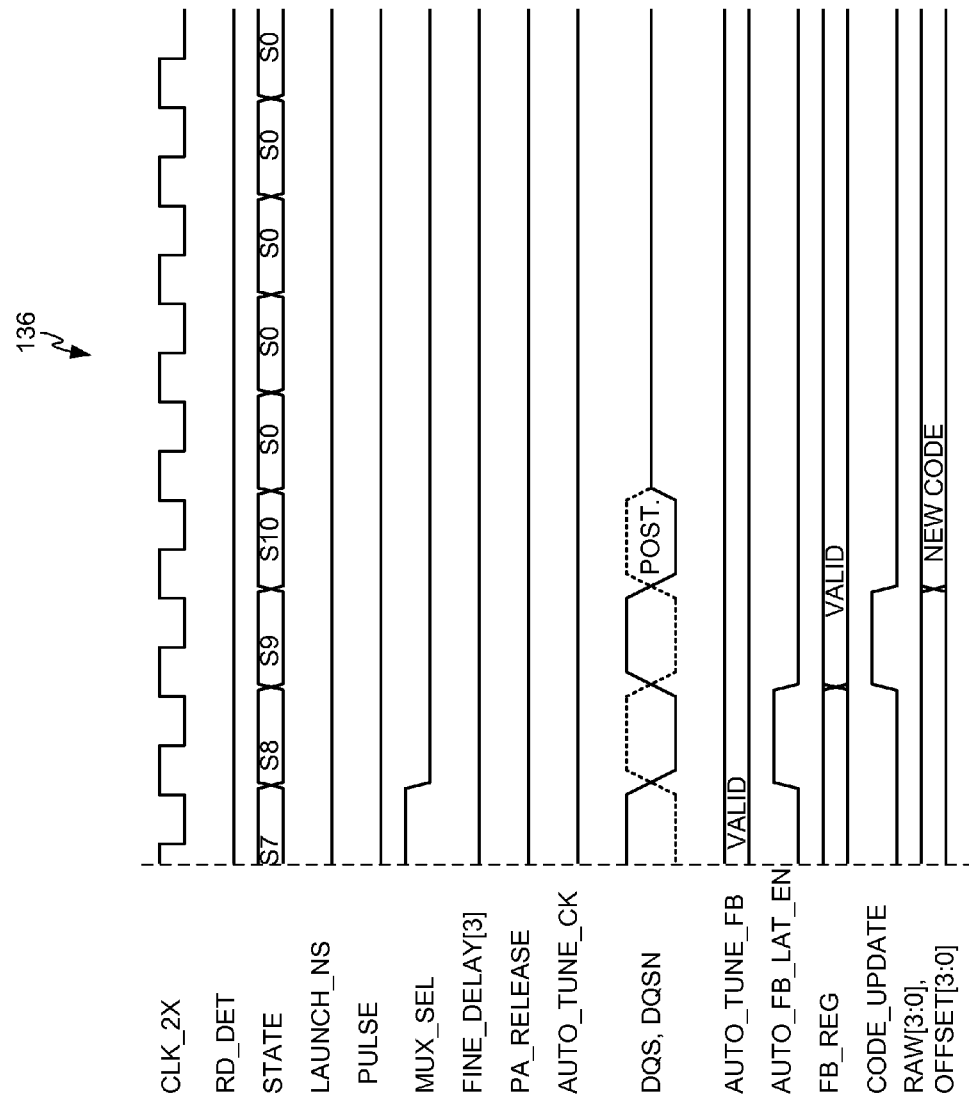
FIG. 17B is a continuation of the timing diagram of FIG. 17A.

The timing diagram 136 of FIGS. 17A-17B illustrates the manner in which state machine 70 and other portions of preamble logic 30 respond to a BL8 read operation, where the most-significant bit of the delay value (RAW[3:0] and OFFSET[3:0]) stored in registers 76 and 78 (FIG. 3), respectively, transitions from a logic-1 to a logic-0 during the read operation. This transition occurs in response to an offset value greater than zero being present on the FINE_CODE_OFFSET input to register circuit 66 (FIG. 3), causing register 78 to hold a most-significant bit with a value of logic-1 and register 76 to hold a most-significant bit with a value of logic-0. With further reference to state diagram 108 (FIG. 4), note that state machine 70 proceeds through the sequence of states: S0, S1, S2, S3, S4, S5, S6, S7, S8, S9, S10, S0.

Figure 18A:
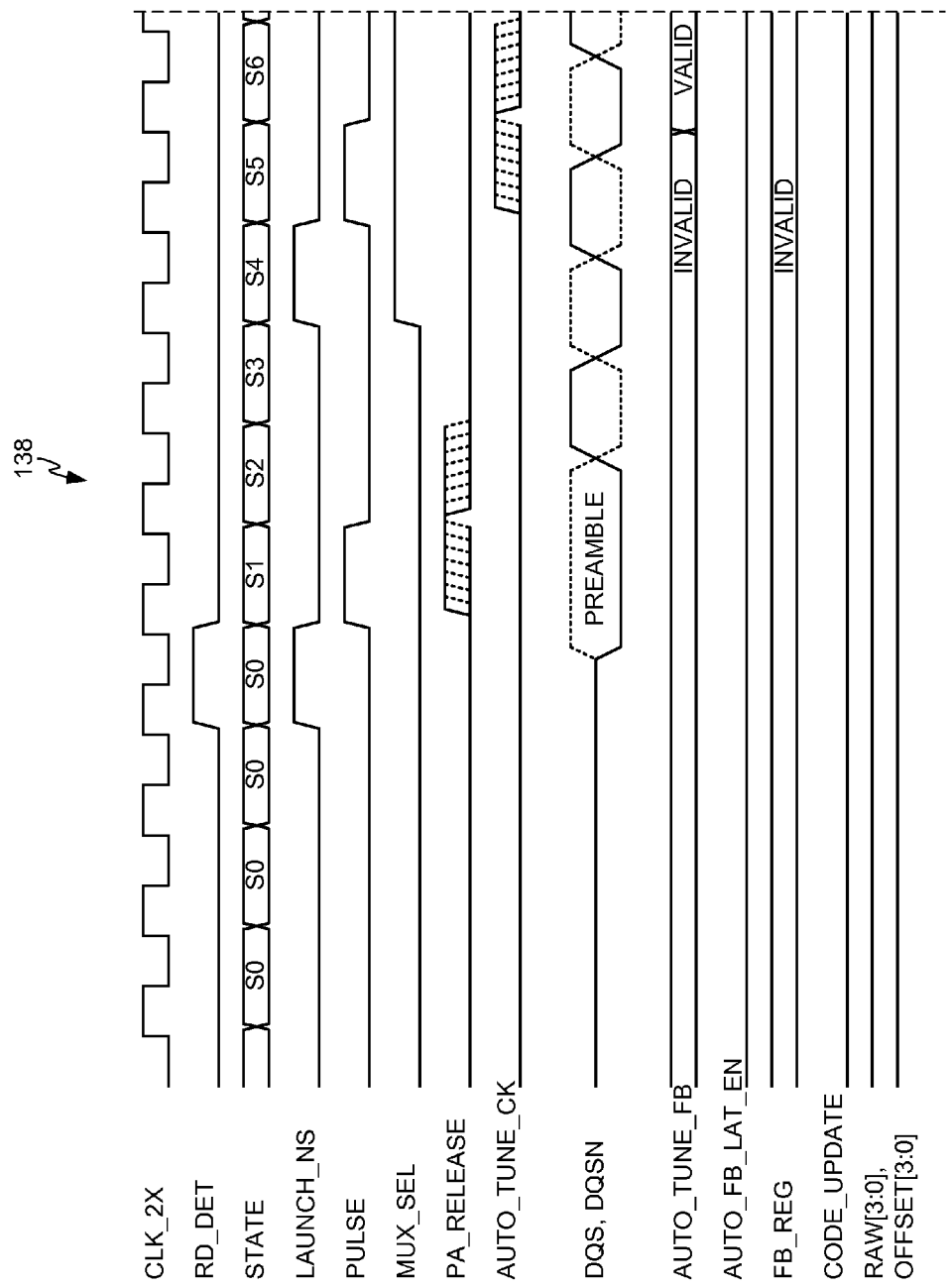
FIG. 18A is a portion of a timing diagram illustrating a first exemplary instance of the operation of the preamble logic.
Figure 18B:
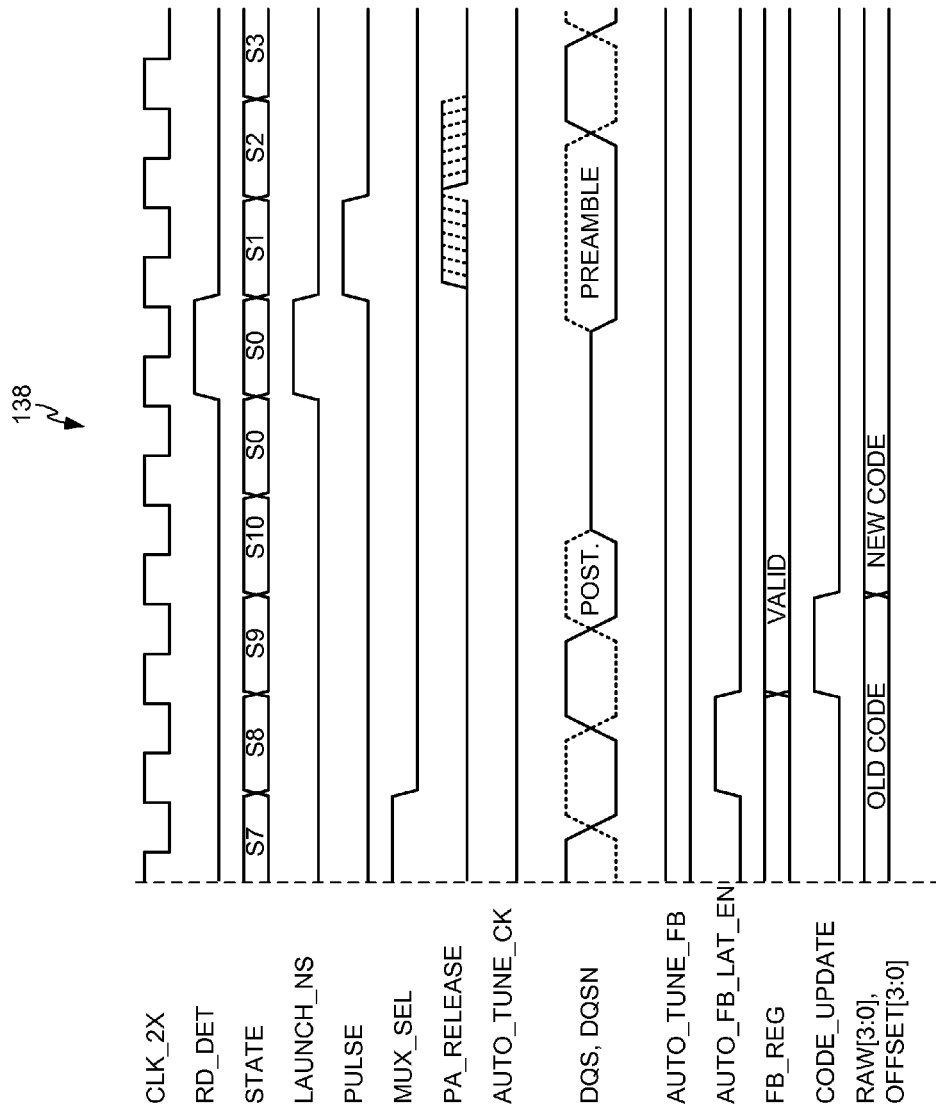
FIG. 18B is a continuation of the timing diagram of FIG. 18A.
Figure 19A:
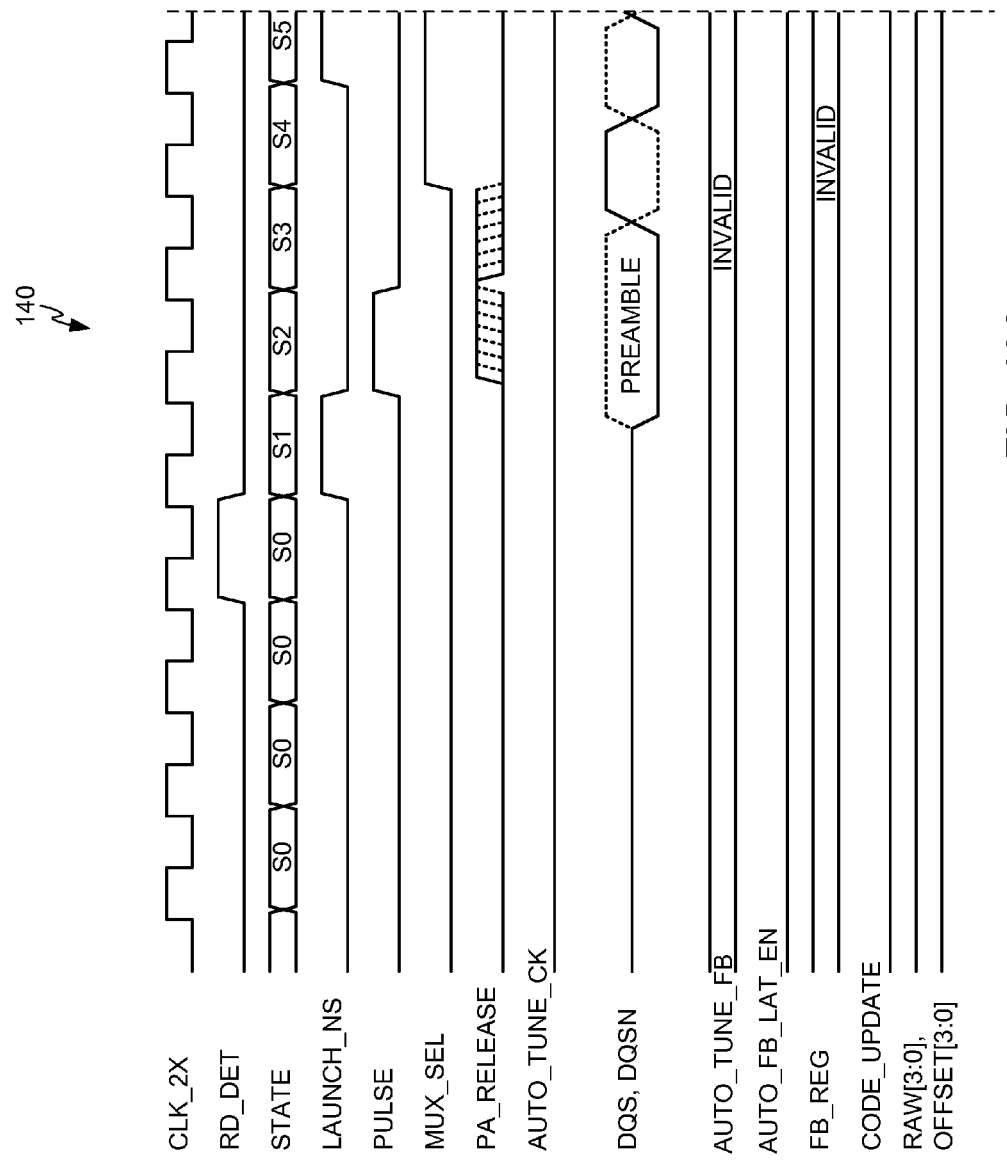
FIG. 19A is a portion of a timing diagram illustrating a second exemplary instance of the operation of the preamble logic.
Figure 19B:
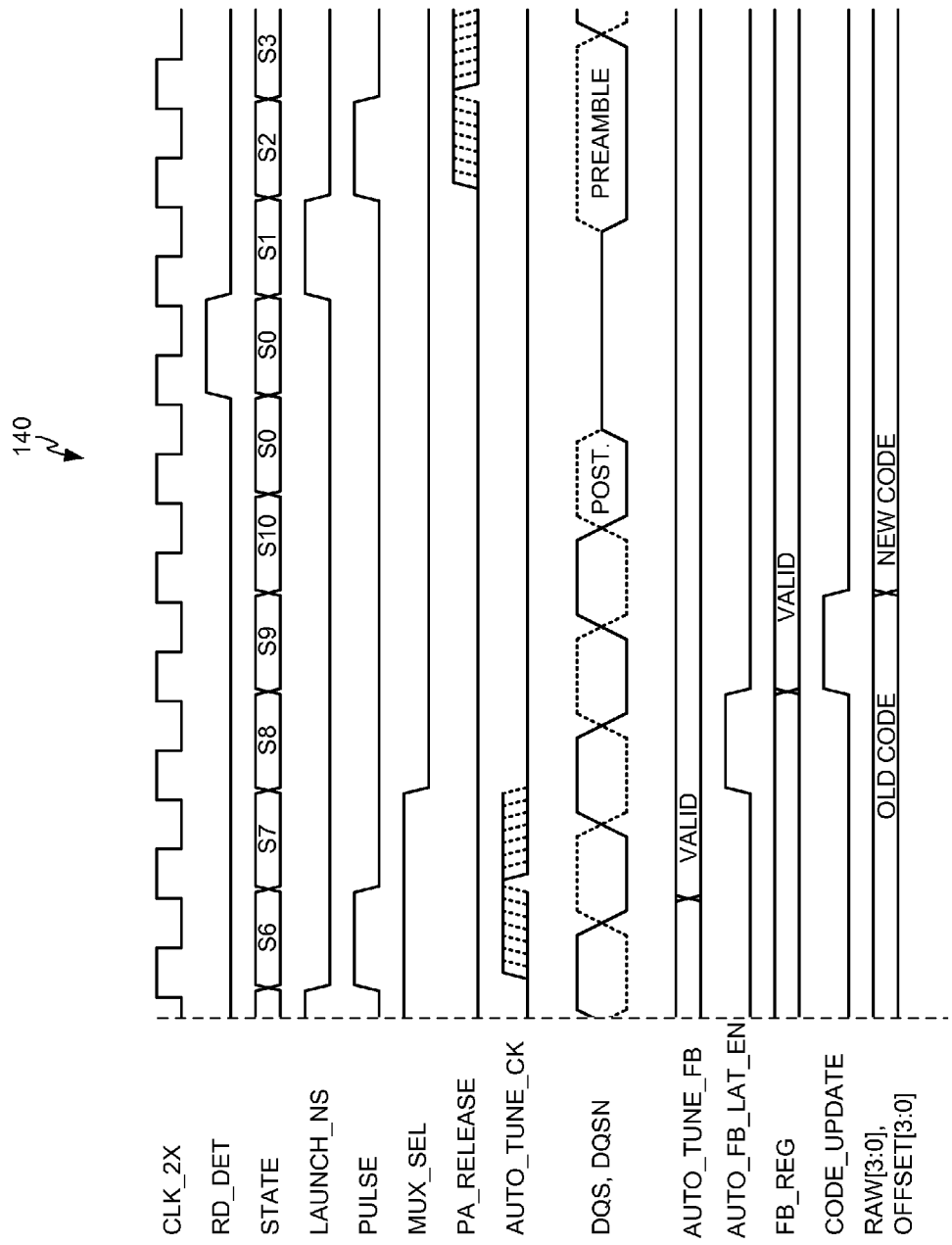
FIG. 19B is a continuation of the timing diagram of FIG. 19A.

The timing diagram 138 of FIGS. 18A-18B illustrates the manner in which state machine 70 and other portions of preamble logic 30 respond to two consecutive BL8 read operations, where the two respective CAS commands are spaced six clock cycles (CLK_1X) apart, and where the most-significant bit of the delay value (RAW[3:0] and OFFSET[3:0]) stored in registers 76 and 78 (FIG. 3), respectively, remains logic-0 during the read operations. With further reference to state diagram 108 (FIG. 4), note that state machine 70 proceeds through the sequence of states: S0, S1, S2, S3, S4, S5, S6, S7, S8, S9, S10, S0 (for two cycles of CLK_3X), S1, S2, S3, etc. The timing diagram 140 of FIGS. 19A-19B relates to a similar event as that to which timing diagram 138 relates, but the most-significant bit of the delay value (RAW[3:0] and OFFSET[3:0]) stored in registers 76 and 78 (FIG. 3), respectively, remains logic-1 during the read operations.

Figure 20A:
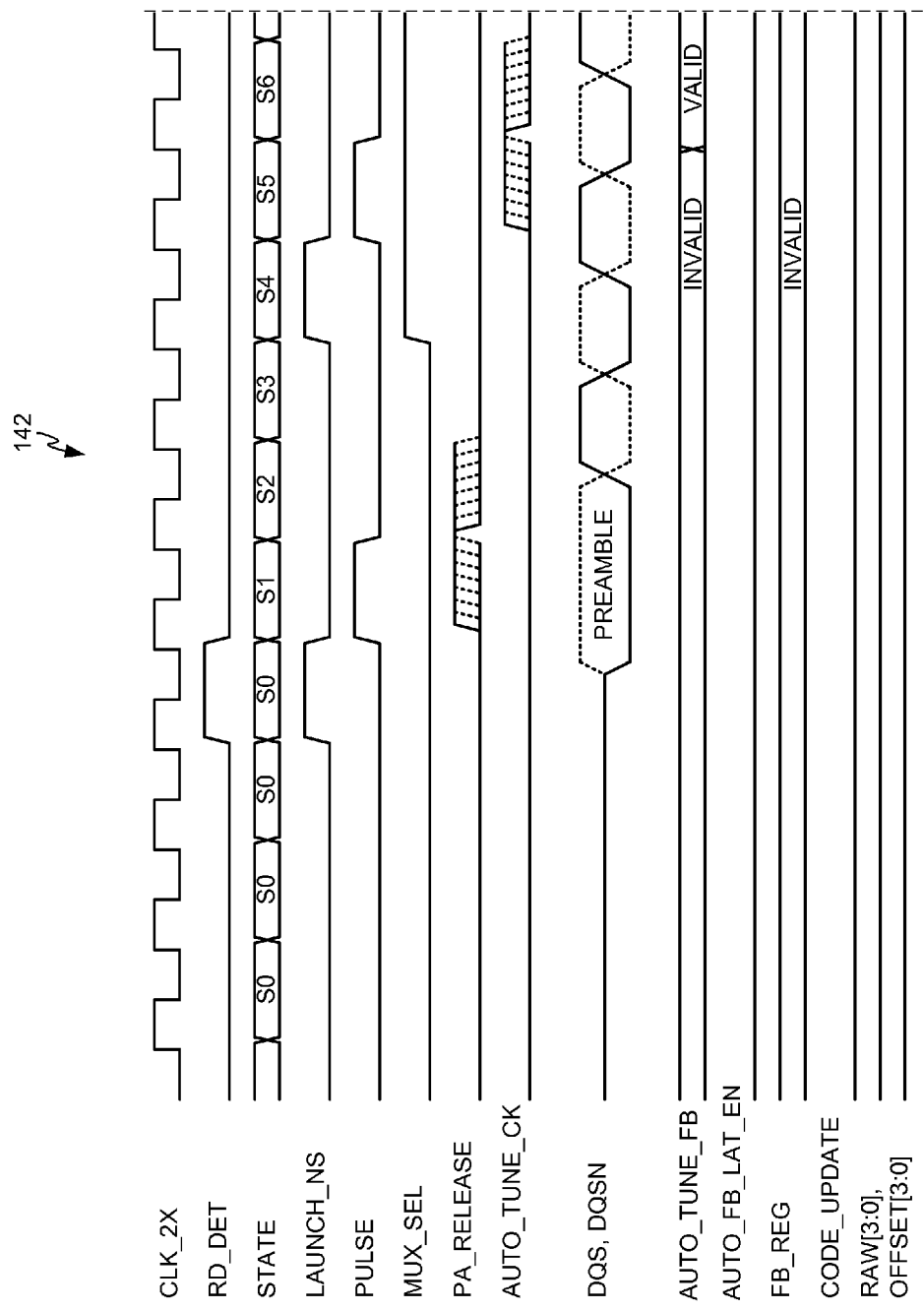
FIG. 20A is a portion of a timing diagram illustrating a third exemplary instance of the operation of the preamble logic.
Figure 20B:
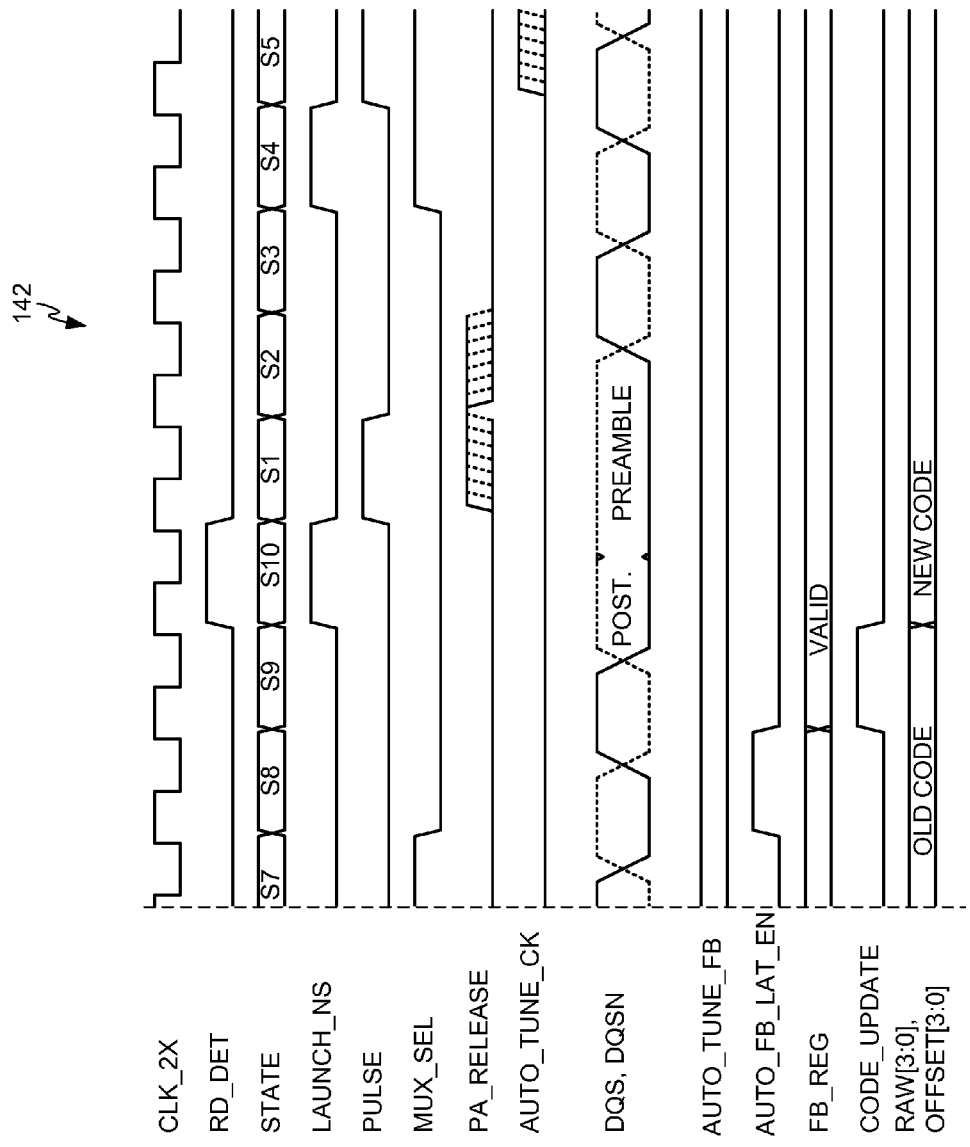
FIG. 20B is a continuation of the timing diagram of FIG. 20A.
Figure 21A:
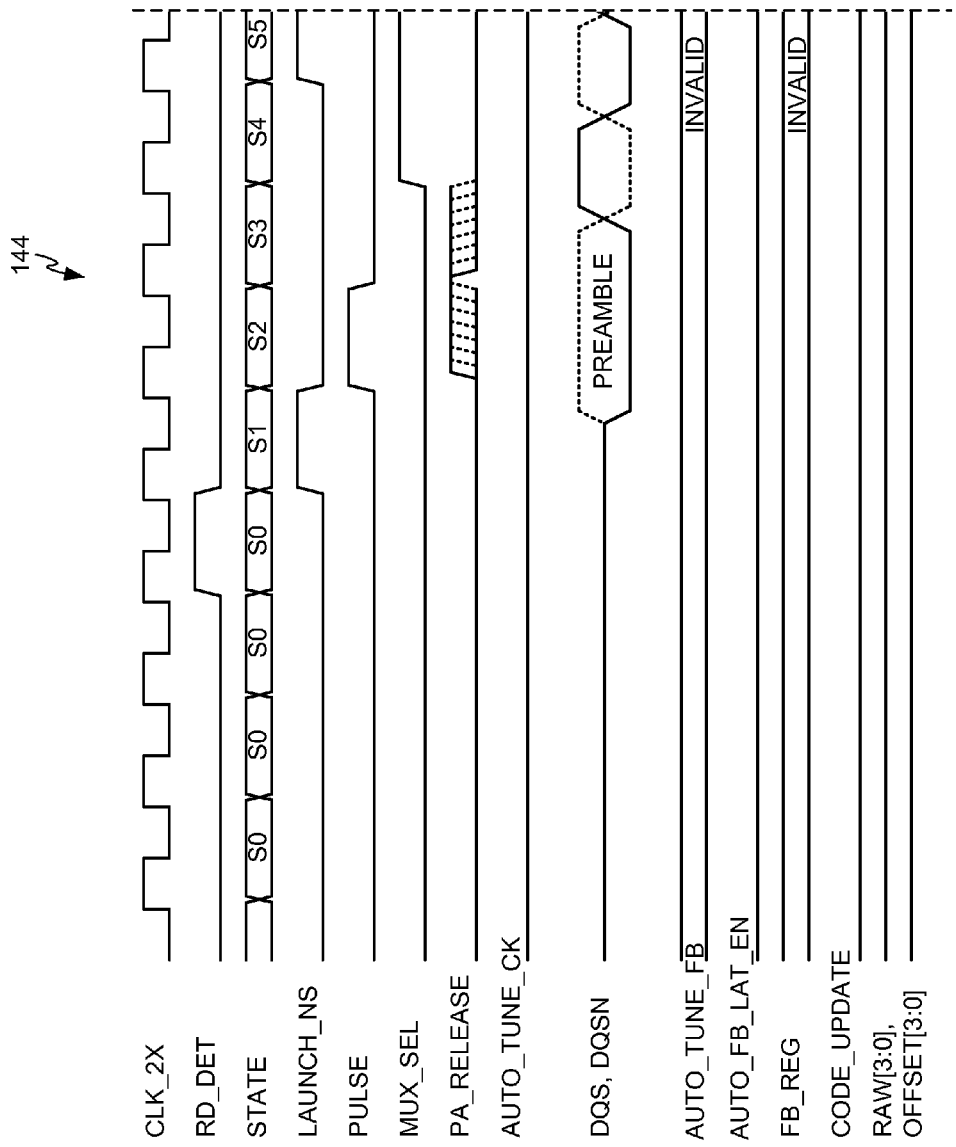
FIG. 21A is a portion of a timing diagram illustrating a fourth exemplary instance of the operation of the preamble logic.
Figure 21B:
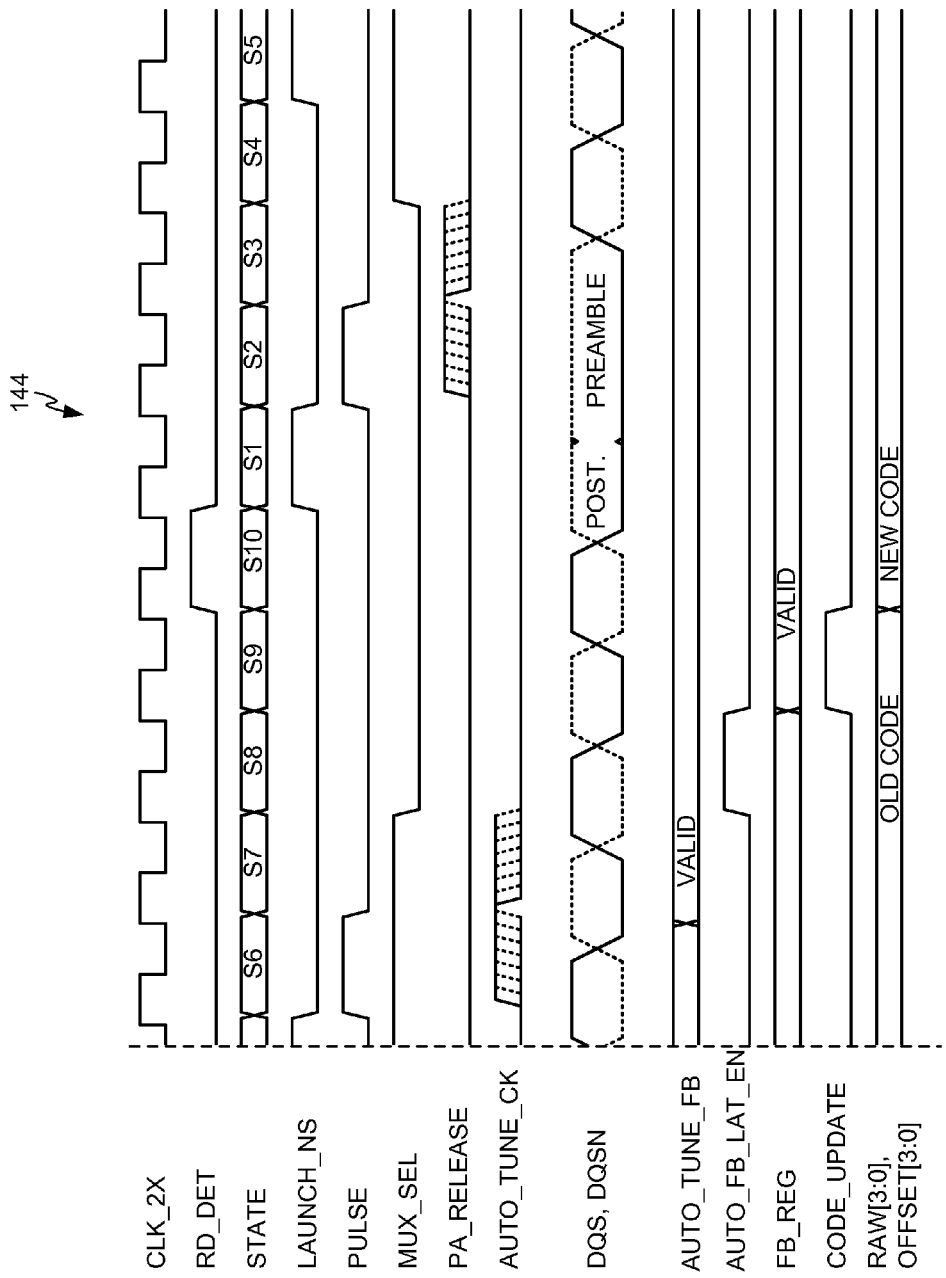
FIG. 21B is a continuation of the timing diagram of FIG. 21A.

The timing diagram 142 of FIGS. 20A-20B illustrates the manner in which state machine 70 and other portions of preamble logic 30 respond to two consecutive BL8 read operations, where the two respective CAS commands are spaced five clock cycles (CLK_1X) apart, and where the most-significant bit of the delay value (RAW[3:0] and OFFSET[3:0]) stored in registers 76 and 78 (FIG. 3), respectively, remains logic-0 during the read operations. With further reference to state diagram 108 (FIG. 4), note that state machine 70 proceeds through the sequence of states: S0, S1, S2, S3, S4, S5, S6, S7, S8, S9, S10, S1, S2, S3, etc. The timing diagram 144 of FIGS. 21A-21B relates to a similar event as that to which timing diagram 142 relates, but the most-significant bit of the delay value (RAW[3:0] and OFFSET[3:0]) stored in registers 76 and 78 (FIG. 3), respectively, remains logic-1 during the read operations.

Figure 22A:
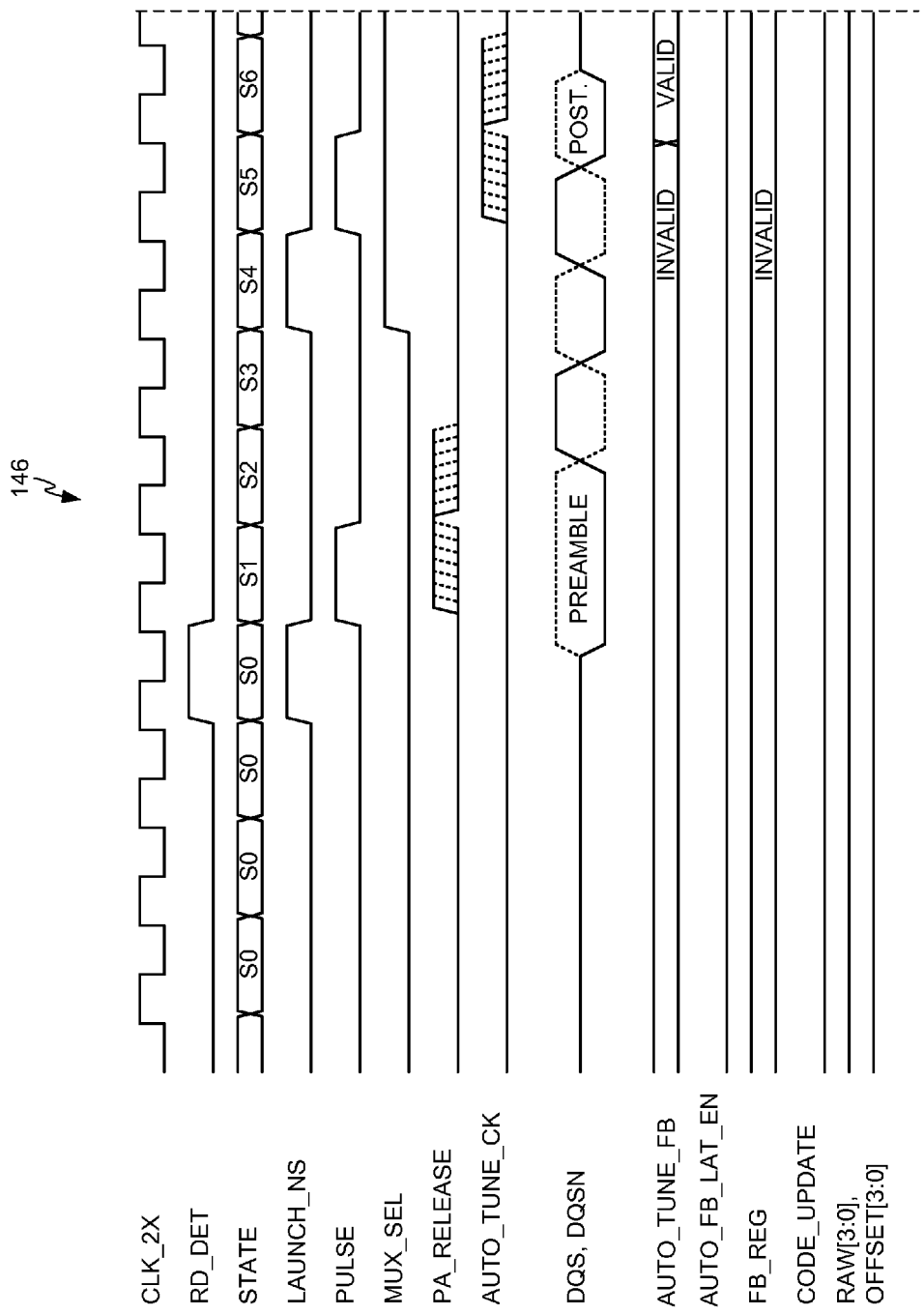
FIG. 22A is a portion of a timing diagram illustrating a fifth exemplary instance of the operation of the preamble logic.
Figure 22B:
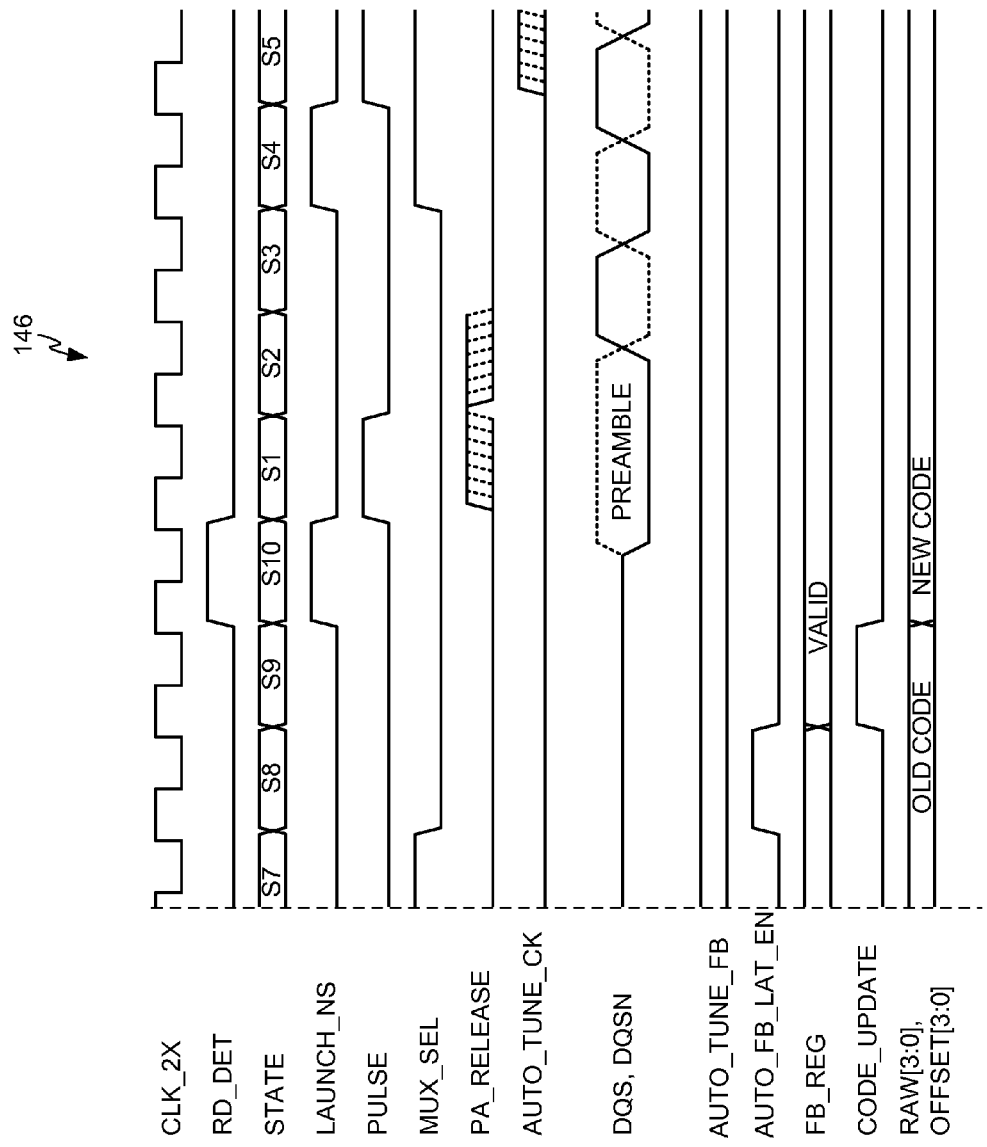
FIG. 22B is a continuation of the timing diagram of FIG. 22A.
Figure 23A:
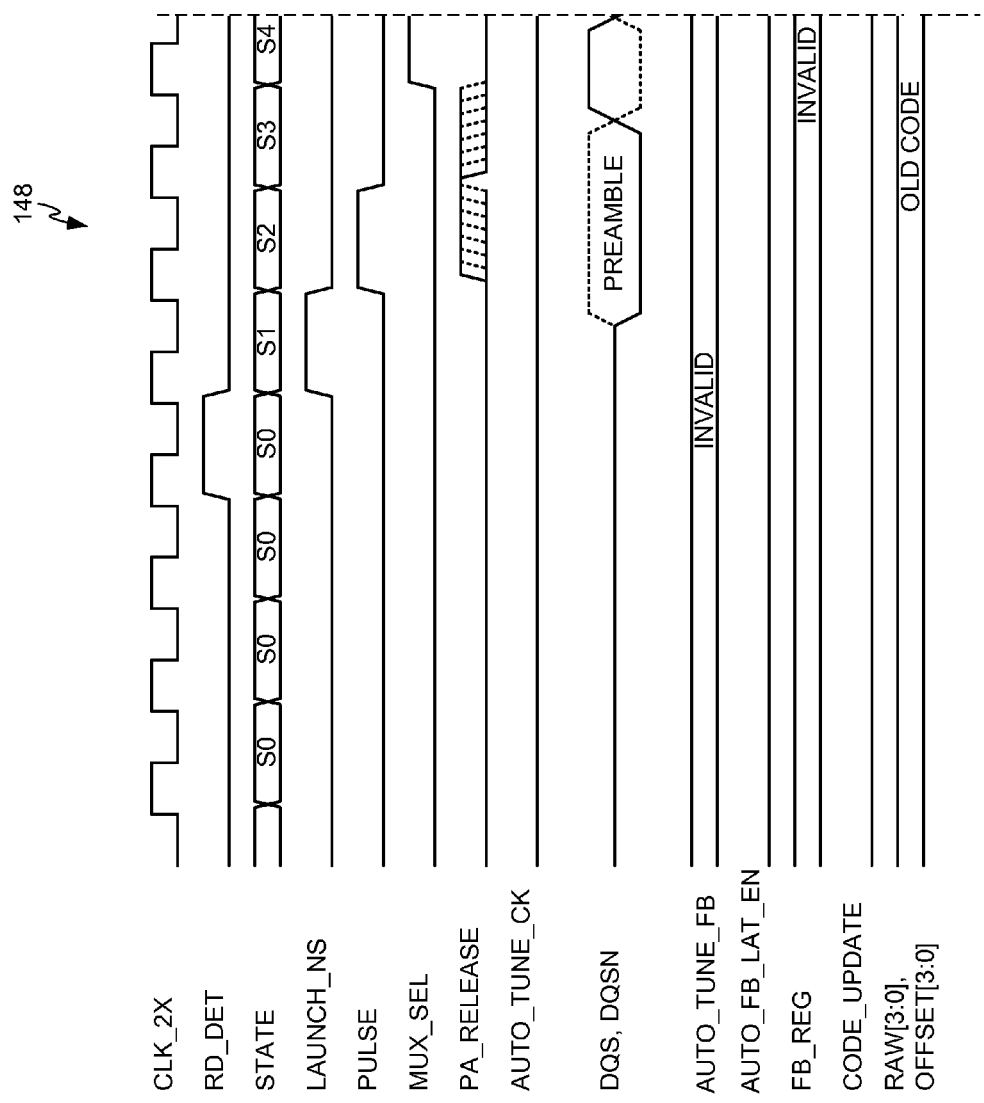
FIG. 23A is a portion of a timing diagram illustrating a sixth exemplary instance of the operation of the preamble logic.
Figure 23B:
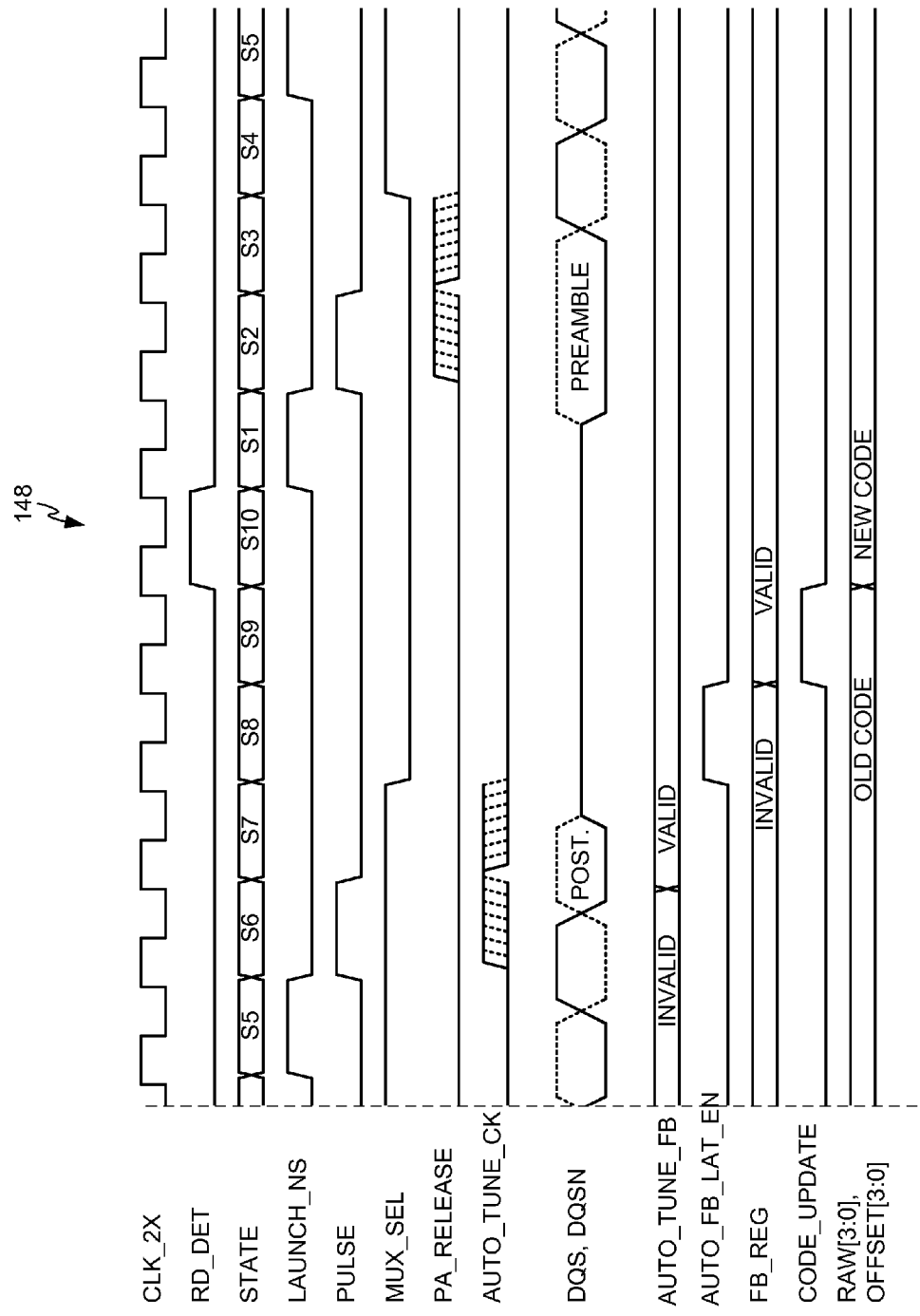
FIG. 23B is a continuation of the timing diagram of FIG. 23A.

The timing diagram 146 of FIGS. 22A-22B illustrates the manner in which state machine 70 and other portions of preamble logic 30 respond to two consecutive BC4 read operations, where the two respective CAS commands are spaced five clock cycles (CLK_1X) apart, and where the most-significant bit of the delay value (RAW[3:0] and OFFSET[3:0]) stored in registers 76 and 78 (FIG. 3), respectively, remains logic-0 during the read operations. With further reference to state diagram 108 (FIG. 4), note that state machine 70 proceeds through the sequence of states: S0, S1, S2, S3, S4, S5, S6, S7, S8, S9, S10, S1, S2, S3, etc. The timing diagram 148 of FIGS. 23A-23B relates to a similar event as that to which timing diagram 146 relates, but the most-significant bit of the delay value (RAW[3:0] and OFFSET[3:0]) stored in registers 76 and 78 (FIG. 3), respectively, remains logic-1 during the read operations.

Figure 24A:
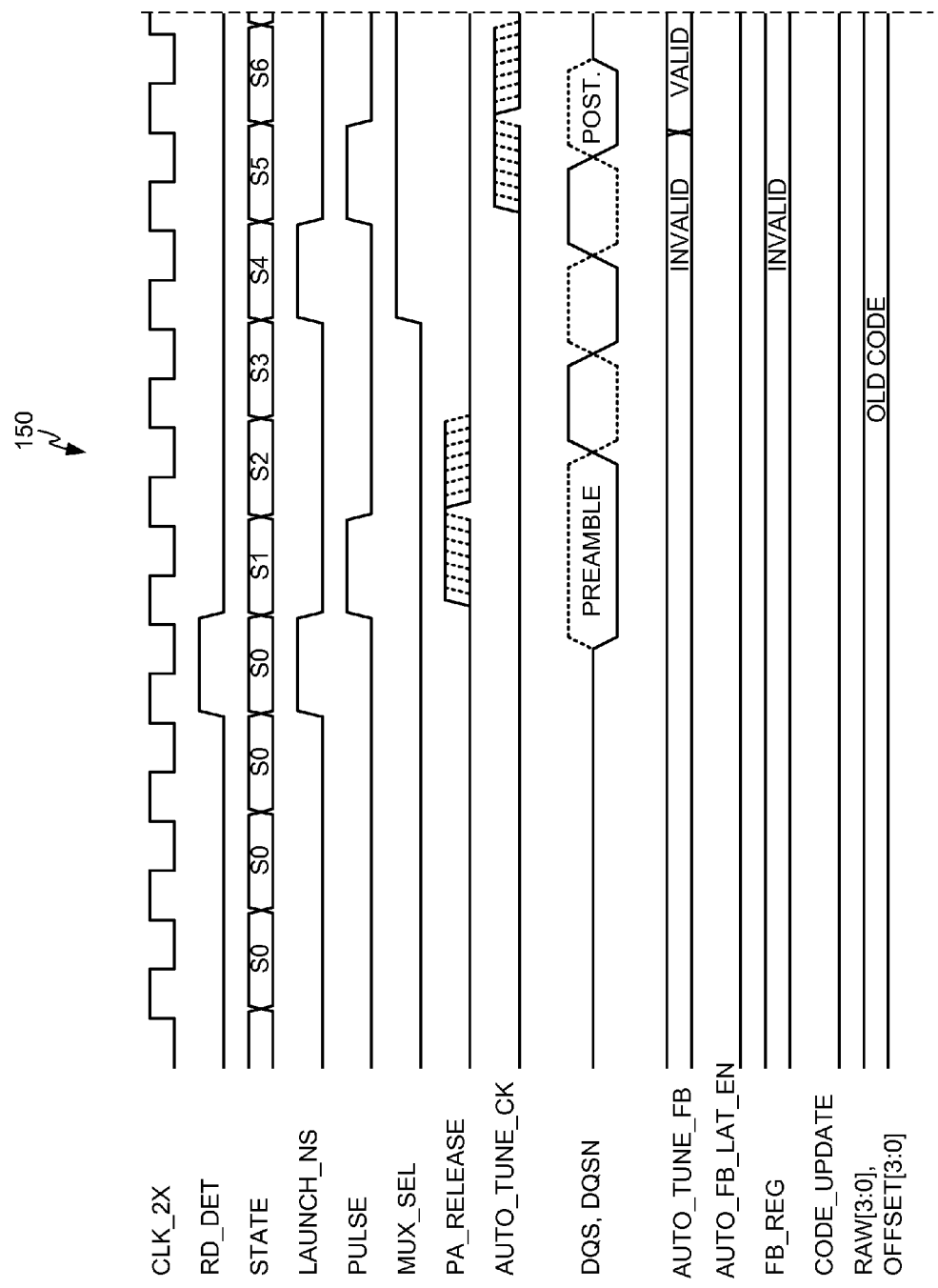
FIG. 24A is a portion of a timing diagram illustrating a seventh exemplary instance of the operation of the preamble logic.
Figure 24B:
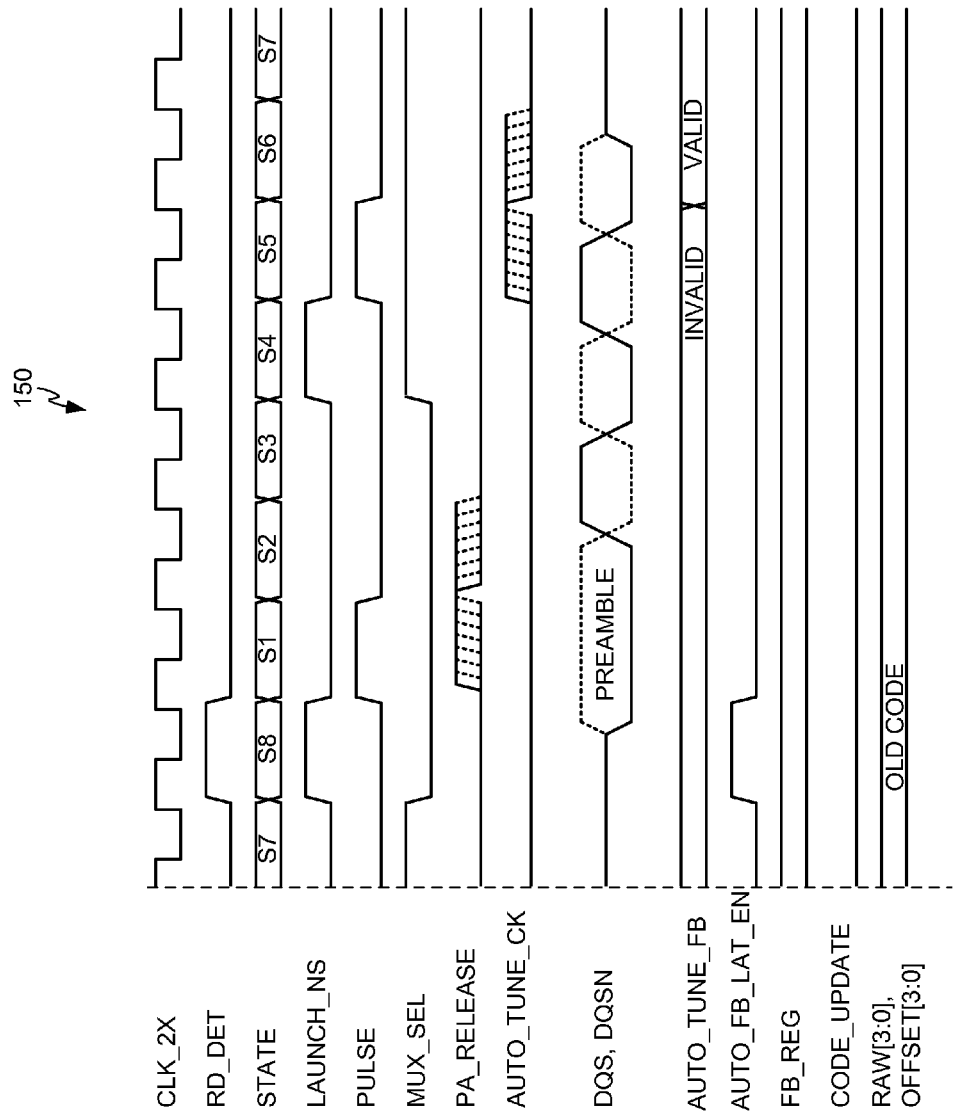
FIG. 24B is a continuation of the timing diagram of FIG. 24A.
Figure 25A:
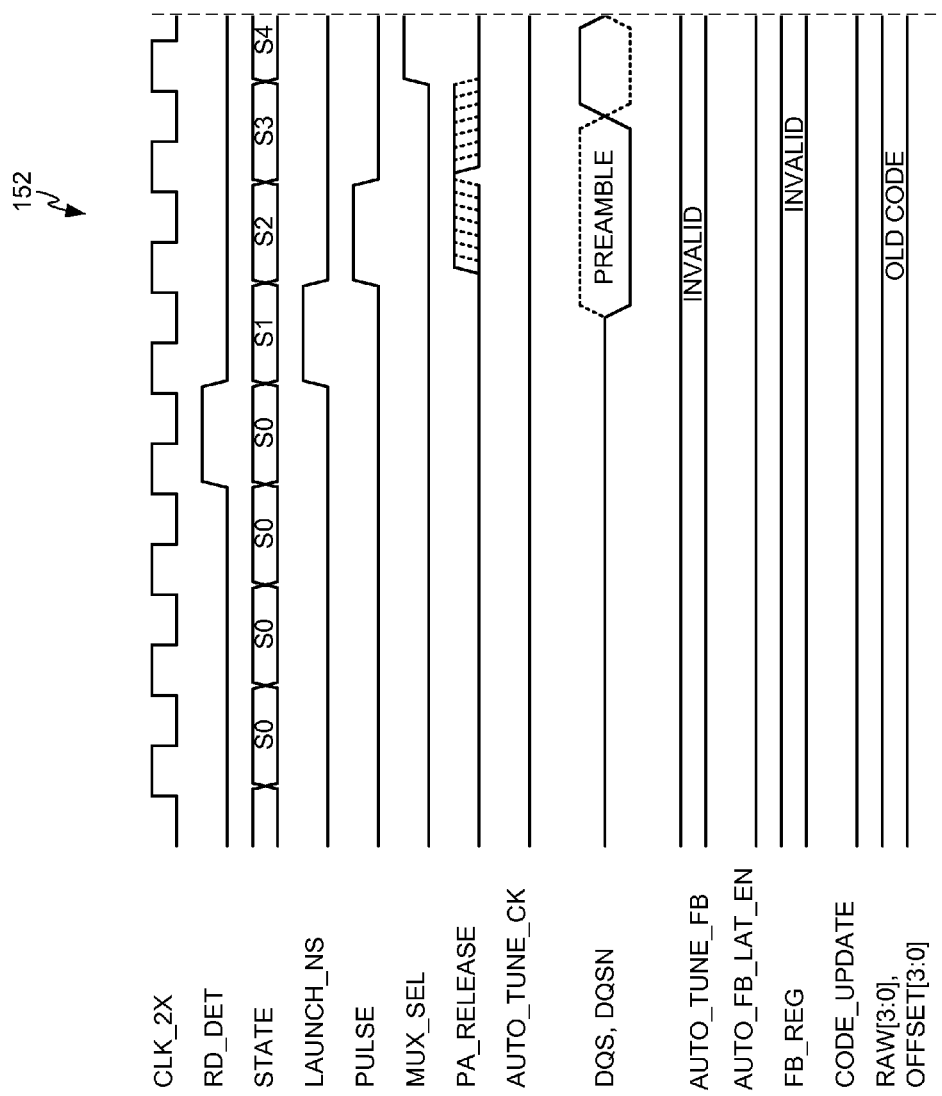
FIG. 25A is a portion of a timing diagram illustrating an eighth exemplary instance of the operation of the preamble logic.
Figure 25B:
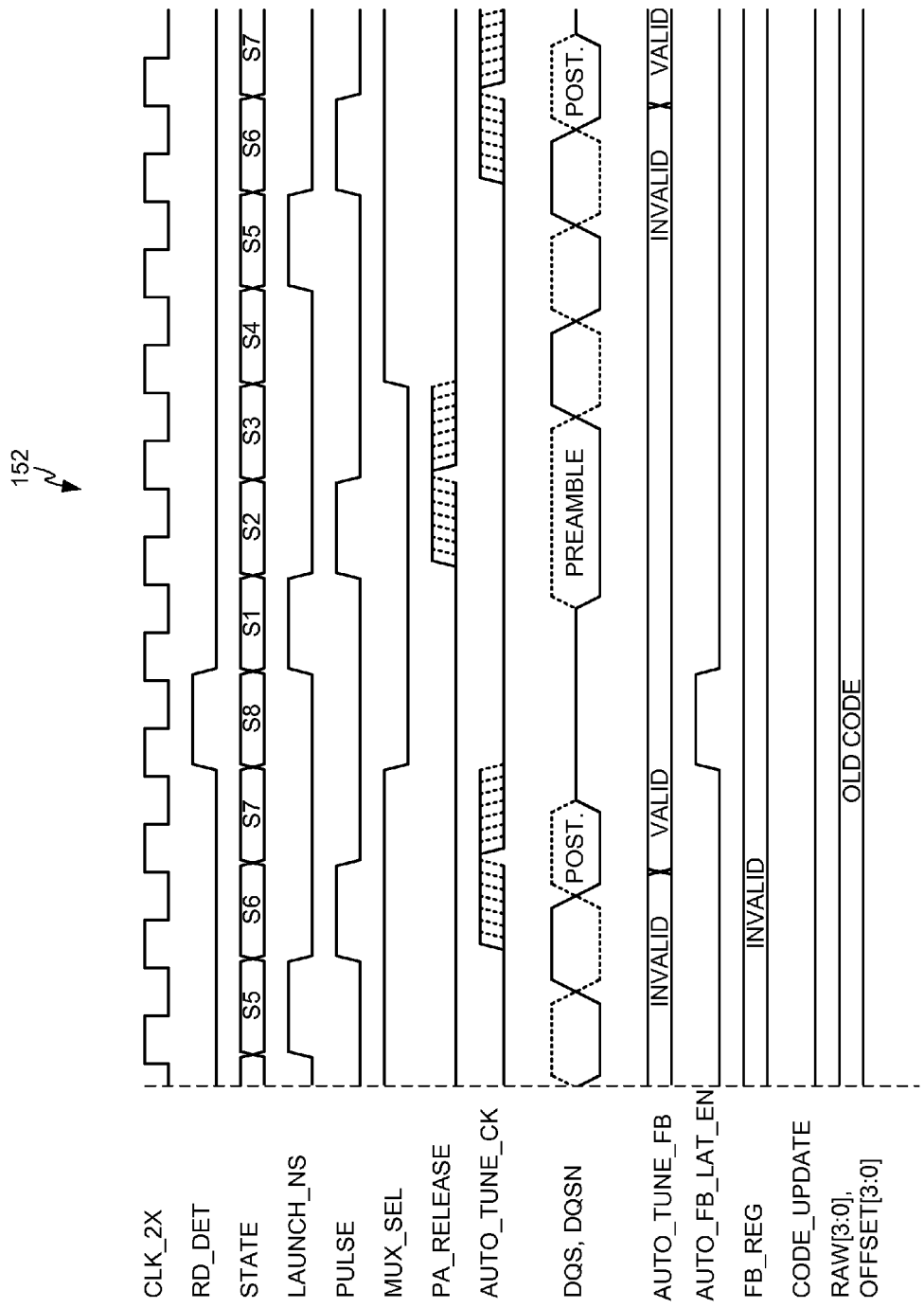
FIG. 25B is a continuation of the timing diagram of FIG. 25A.

The timing diagram 150 of FIGS. 24A-24B illustrates the manner in which state machine 70 and other portions of preamble logic 30 respond to two consecutive BC4 read operations, where the two respective CAS commands are spaced four clock cycles (CLK_1X) apart, and where the most-significant bit of the delay value (RAW[3:0] and OFFSET[3:0]) stored in registers 76 and 78 (FIG. 3), respectively, remains logic-0 during the read operations. With further reference to state diagram 108 (FIG. 4), note that state machine 70 proceeds through the sequence of states: S0, S1, S2, S3, S4, S5, S6, S7, S8, S1, S2, S3, S4, S5, S6, etc. The timing diagram 152 of FIGS. 25A-25B relates to a similar event as that to which timing diagram 150 relates, but the most-significant bit of the delay value (RAW[3:0] and OFFSET[3:0]) stored in registers 76 and 78 (FIG. 3), respectively, remains logic-1 during the read operations.

Figure 26:
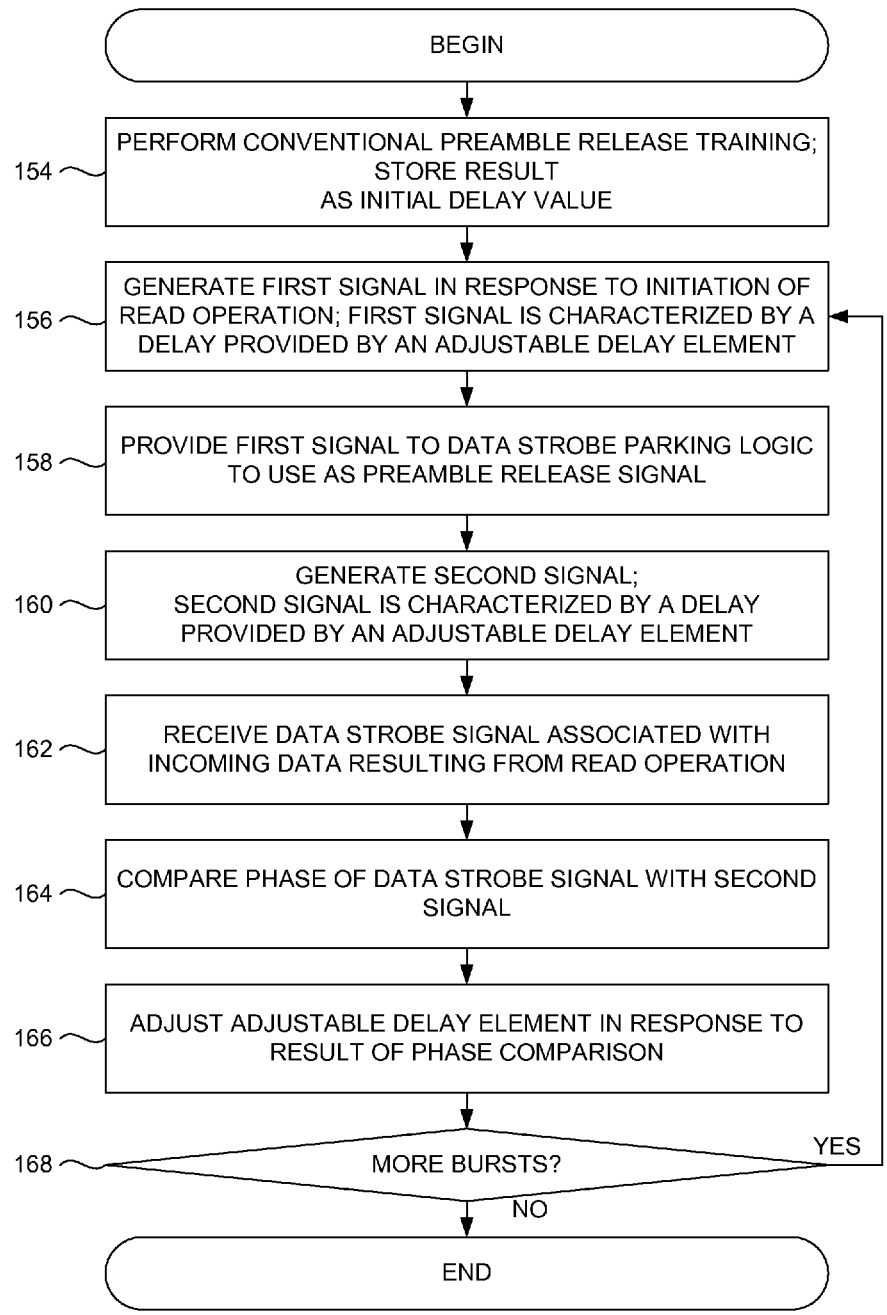
FIG. 26 is a flow diagram illustrating the preamble release training method, in accordance with an exemplary embodiment of the invention.

The above-described method of operation of interface 18 with regard to preamble release training can be summarized as indicated by the flow diagram of FIG. 26. As indicated by block 154, training controller 16 can initialize preamble logic 30 by first performing initial preamble release training. To perform conventional preamble release training, training controller 16 first sets the auto-tune enable signal (AUTO_TUNE_EN) to logic-0, thereby disabling the continuous or auto-tuning preamble release feature, and loads an initial delay value into registers 76 and 78. Training controller then initiates a read operation and samples the output of flip-flop 64 (via sampling circuitry that is not shown for purposes of clarity), which captures the state of the data strobe signal in response to being clocked by the preamble release signal. Training controller 16 can repeat this procedure in an iterative manner, setting a different delay value on each iteration. From the results captured in the sampling register, training controller 16 can compute an optimum delay value that places the preamble release signal close to the middle of the preamble. Training controller 16 can load registers 76 and 78 with this optimum delay value. Then, training controller 16 sets the auto-tune enable signal (AUTO_TUNE_EN) to logic-1, thereby enabling the continuous or auto-tuning preamble release feature. The continuous or auto-tuning preamble release feature then adjusts the preamble release delay value after some or all subsequent read operations in preparation for the release of the preamble prior to another read operation. More specifically, the method proceeds in accordance with blocks 156-166.

As indicated by block 156, preamble logic 30 (FIG. 3) generates the first signal in response to initiation of a read operation by memory controller 14. In the manner described above, the first signal is characterized by a delay from the initiation of the read operation by one or more clock cycles plus a fine delay provided by adjustable delay element 62. As indicated by block 158, preamble logic 30 provides the first signal in the form of the preamble release signal (PA_RELEASE) to data strobe parking logic 32. As indicated by block 160, preamble logic 30 generates the second signal in response to the initiation of the read operation. In the manner described above, the second signal is similarly characterized by a delay provided by adjustable delay element 62. In response to the initiation of the read operation, DRAM module 12 transmits a preamble followed by one or more bursts of data in synchronism with a data strobe signal. As indicated by block 162, preamble logic 30 receives the data strobe signal associated with the incoming data. As indicated by block 164, preamble logic 30 performs a phase comparison between an edge of the (delayed) second signal and an edge of the data strobe signal associated with the incoming data. As indicated by block 166, preamble logic 30 then adjusts adjustable delay element 62 in response to the result of the comparison. The adjusted delay is then applied to a subsequent instance in which the preamble release signal is generated.

As indicated by block 168, if the read operation includes more than one burst, then the method continues as described above with regard to block 156. It should be understood that for purposes of clarity the flow diagram of FIG. 26 relates to only a single instance of the method, and that the continuous or auto-tuning preamble release method (blocks 156-166) is performed multiple times as read operations occur. In this manner, the method uses feedback from read operations to adjust the preamble release signal so that it continues to be activated close to the middle of the preamble.

It should be noted that the invention has been described with respect to illustrative embodiments for the purpose of describing the principles and concepts of the invention. The invention is not limited to these embodiments. As will be understood by those skilled in the art in view of the description being provided herein, many modifications may be made to the embodiments described herein without deviating from the goals of the invention, and all such modifications are within the scope of the invention.

What is claimed is:

1. A method for preamble release training in a double data-rate memory device interface, comprising:
    generating a first signal in response to an initiation of a read operation, the first signal delayed from the initiation of the read operation by one or more clock cycles plus a fine delay of less than one clock cycle provided by an adjustable delay circuit;
    providing the first signal to a data strobe parking circuit, wherein the first signal is generated in response to an output of a state machine;
    generating a second signal in response to the initiation of the read operation, the second signal delayed by the adjustable delay circuit, wherein the second signal is generated in response to the output of the state machine;
    receiving a data strobe signal associated with incoming data during the read operation;
    comparing an edge of the second signal with an edge of the data strobe signal associated with incoming data during the read operation; and
    adjusting the adjustable delay circuit in response to a result of comparing the edge of the second signal with the edge of the data strobe signal, wherein the adjustable delay circuit receives a delay input from a first delay register to generate the first signal and receives the delay input from a second delay register to generate the second signal, and wherein adjusting the adjustable delay comprises the state machine producing an adjustment output signal and then selecting one of incrementing and decrementing a first value stored in the first delay register and a second value stored in the second delay register based in part on a state of the adjustment output signal.

2. The method of claim 1, wherein:
    the state machine selects one of the first delay register and the second delay register to provide an output to the adjustable delay circuit; and
    the state machine receives a most-significant bit of a selected one of the first delay register and the second delay register, and the adjustable delay circuit receives less significant bits of the selected one of the first delay register and the second delay register except the most significant bit.

3. The method of claim 1, further comprising adding a fine offset value to one of a first value stored in the first delay register and the second value stored in the second delay register.

4. The method of claim 1, wherein:
generating a first signal comprises generating a first pulse; and
generating a second signal comprises generating a second pulse.

5. A system for preamble release training in an interface between an application-specific integrated circuit (ASIC) and a double data-rate memory device, comprising:
an adjustable delay circuit;
an auto-tune circuit configured to generate a first signal and a second signal in response to an initiation of a read operation by the ASIC, the adjustable delay circuit delaying the first signal to produce a preamble release signal and delaying the second signal to produce an auto-tune clock signal, wherein the auto-tune circuit comprises a state machine;
a data strobe parking circuit having an input receiving a data strobe signal associated with incoming data during the read operation and having an output switchable between a data strobe signal and a fixed voltage, switching of the preamble release being controlled by the preamble release signal;
a comparator circuit configured to compare an edge of the auto-tune clock signal with an edge of the data strobe signal associated with incoming data during the read operation, wherein the auto-tune circuit provides an adjustment signal to the adjustable delay in response to a result of comparing the edge of the second signal with the edge of the data strobe signal;
a multiplexer having an output providing the adjustment signal to the adjustable delay circuit, the multiplexer receiving a multiplexer control signal from the auto-tune circuit;
a first delay register having an output coupled to a first input of the multiplexer; and
a second delay register having an output coupled to a second input of the multiplexer; and
delay adjustment logic; and
wherein:
the adjustable delay circuit delays the first signal in response to a first output of the state machine produced when the state machine is in a first state;
the adjustable delay delays the second signal in response to a second output of the state machine produced when the state machine is in a second state
the state machine generates the multiplexer control signal;
the state machine receives a most-significant bit of a selected one of the first delay register and the second delay register, and the adjustable delay circuit receives all bits of the selected one of the first delay register and the second delay register except the most significant bit;
the state machine is responsive to a read enable signal provided by the ASIC; and
the state machine produces an adjustment output signal, and the delay adjustment logic is configured to increment a first value stored in the first delay register and a second value stored in the second delay register when the adjustment output signal has a first state and decrement the first value stored in the first delay register and the second value stored in the second delay register when the adjustment output signal has a second state.

6. The system of claim 5, wherein the first delay register and the second delay register are loadable by the ASIC.

7. The system of claim 5, further comprising adder circuit configured to add a fine offset value to one of the first value stored in the first delay register and the second value stored in the second delay register.

8. The system of claim 5, wherein the comparator comprises a flip-flop having a clock input receiving the auto-tune clock signal and a data input receiving the data strobe signal.

9. The system of claim 5, wherein:
the auto-tune circuit comprises a state machine responsive to a read enable signal provided by the ASIC; and
the state machine is configured to transition states in response to a clock signal.

10. The system of claim 9, wherein the state machine includes a state transition responsive to two consecutive read operations occurring within a predetermined number of clock cycles of each other.

11. The system of claim 9, wherein the state machine is configured to generate the first signal and the second signal in response to a current state, the read enable signal, and a most-significant bit of a selected one of the first delay register and the second delay register.

12. The system of claim 11, wherein the adjustable delay circuit receives all bits of the selected one of the first delay register and the second delay register except the most significant bit.

13. The system of claim 5, wherein the auto-tune circuit is configured to generate the first signal as a first pulse and to generate the second signal as a second pulse.

14. A system for preamble release training in an interface between an application-specific integrated circuit (ASIC) and a double data-rate memory device, comprising:
an adjustable delay circuit;
an auto-tune circuit configured to generate a first signal and a second signal in response to an initiation of a read operation by the ASIC, the adjustable delay circuit delaying the first signal to produce a preamble release signal and delaying the second signal to produce an auto-tune clock signal;
a data strobe parking circuit having an input receiving a data strobe signal associated with incoming data during the read operation and having an output switchable between a data strobe signal and a fixed voltage, switching of the preamble release being controlled by the preamble release signal; and
a comparator circuit configured to compare an edge of the auto-tune clock signal with an edge of the data strobe signal associated with incoming data during the read operation, wherein the auto-tune circuit provides an adjustment signal to the adjustable delay in response to a result of comparing the edge of the second signal with the edge of the data strobe signal;
wherein:
the auto-tune circuit comprises a state machine responsive to a read enable signal provided by the ASIC;
the state machine is configured to transition states in response to a clock signal;
the state machine is configured to generate the first signal and the second signal in response to a current state, the read enable signal, and a most-significant bit of a selected one of the first delay register and the second delay register, and
the adjustable delay circuit receives all bits of the selected one of the first delay register and the second delay register except the most significant bit.

15. The system of claim 14, wherein the auto-tune circuit is configured to generate the first signal as a first pulse and to generate the second signal as a second pulse.

16. The system of claim 14, wherein the state machine includes a state transition responsive to two consecutive read operations occurring within a predetermined number of clock cycles of each other.

17. The system of claim 14, wherein the comparator circuit comprises a flip-flop having a clock input receiving the auto-tune clock signal and a data input receiving the data strobe signal.

18. The system of claim 14, further comprising:
a multiplexer having an output providing the adjustment signal to the adjustable delay circuit, the multiplexer receiving a multiplexer control signal from the auto-tune circuit;
a first delay register having an output coupled to a first input of the multiplexer; and
a second delay register having an output coupled to a second input of the multiplexer.

19. The system of claim 18, wherein the first delay register and the second delay register are loadable by the ASIC.

20. The system of claim 18, wherein:
the auto-tune circuit comprises a state machine;
the adjustable delay circuit delays the first signal in response to a first output of the state machine produced when the state machine is in a first state; and
the adjustable delay delays the second signal in response to a second output of the state machine produced when the state machine is in a second state.

21. The system of claim 20, wherein:
the state machine generates the multiplexer control signal; and
the state machine receives a most-significant bit of a selected one of the first delay register and the second delay register, and the adjustable delay circuit receives all bits of the selected one of the first delay register and the second delay register except the most significant bit.

* * * * *